United States Patent
Elgar et al.

(10) Patent No.: US 8,138,782 B2
(45) Date of Patent: Mar. 20, 2012

(54) PHOTOVOLTAIC CELL SOLAR SIMULATOR

(75) Inventors: Yacov Elgar, Sunnyvale, CA (US); Danny Cam Toan Lu, San Francisco, CA (US); Tzay-Fa Su, San Jose, CA (US); Jeffrey S. Sullivan, Castro Valley, CA (US); David Tanner, San Jose, CA (US); Harry Whitesell, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 627 days.

(21) Appl. No.: 12/351,087

(22) Filed: Jan. 9, 2009

(65) Prior Publication Data
US 2009/0179651 A1    Jul. 16, 2009

Related U.S. Application Data

(60) Provisional application No. 61/020,304, filed on Jan. 10, 2008.

(51) Int. Cl.
*G01R 31/26*    (2006.01)
(52) U.S. Cl. .............. 324/761.01; 324/501; 136/290; 250/200
(58) Field of Classification Search ............ 324/761.01, 324/501, 96, 715–718, 757.01; 29/890.033; 414/225.01, 217; 136/290; 250/238–239, 250/200
See application file for complete search history.

(56) References Cited

U.S. PATENT DOCUMENTS

| | | | |
|---|---|---|---|
| 4,423,469 A | 12/1983 | Zerlaut et al. | |
| 4,641,227 A | 2/1987 | Kusuhara | |
| 5,984,484 A | 11/1999 | Kruer | |
| 6,077,722 A | 6/2000 | Jansen et al. | |
| 6,265,242 B1 | 7/2001 | Komori et al. | |
| 6,288,325 B1 | 9/2001 | Jansen et al. | |
| 6,455,347 B1 | 9/2002 | Hiraishi et al. | |
| 6,590,149 B2 | 7/2003 | Adelhelm | |
| 6,784,361 B2 | 8/2004 | Carlson et al. | |
| 7,514,931 B1 * | 4/2009 | Shimotomai et al. ......... | 324/403 |
| 2002/0033191 A1 | 3/2002 | Kondo et al. | |
| 2006/0103371 A1 * | 5/2006 | Manz .................... | 324/158.1 |

OTHER PUBLICATIONS

Detlev Koch-Ospelt. "End-to-End Mass Production Solutions for Gen 1 & 2 Silicon Thin Film Modules". Power Point. Jun. 13, 2007.

* cited by examiner

*Primary Examiner* — Arleen M Vazquez
(74) *Attorney, Agent, or Firm* — Patterson & Sheridan, L.L.P.

(57) ABSTRACT

Embodiments of the present invention relate to a solar simulator module of a solar cell production line. In one embodiment the solar simulator receives a solar cell module in a horizontal position and reorients the module into a vertical position. A light source is oriented to emit a flash of light in a substantially horizontal orientation toward the vertically oriented solar cell module. In one embodiment, an automated labeling device affixes a label including the electrical characteristics measured onto a back surface of the solar cell module. In one embodiment, a plurality of solar cell modules are received and tested simultaneously.

25 Claims, 12 Drawing Sheets

PHOTOVOLTAIC CELL SOLAR SIMULATOR

CROSS-REFERENCE TO RELATED APPLICATIONS

This application claims benefit of U.S. Provisional Patent Application Ser. No. 61/020,304, filed Jan. 10, 2008, which is incorporated by reference in its entirety herein.

This application is related to U.S. application Ser. No. 12/202,199, filed Aug. 29, 2008 and U.S. application Ser. No. 12/201,840, filed Aug. 29, 2008.

BACKGROUND OF THE INVENTION

1. Field of the Invention

Embodiments of the present invention generally relate to apparatus and processes for testing and qualifying a solar cell device in a solar cell production line.

2. Description of the Related Art

Photovoltaic (PV) devices or solar cells are devices which convert sunlight into direct current (DC) electrical power. Typical thin film PV devices, or thin film solar cells, have one or more p-i-n junctions. Each p-i-n junction comprises a p-type layer, an intrinsic type layer, and an n-type layer. When the p-i-n junction of the solar cell is exposed to sunlight (consisting of energy from photons), the sunlight is converted to electricity through the PV effect. Solar cells may be tiled into larger solar arrays. The solar arrays are created by connecting a number of solar cells and joining them into panels with specific frames and connectors.

Typically, a thin film solar cell includes active regions, or photoelectric conversion units, and a transparent conductive oxide (TCO) film disposed as a front electrode and/or as a back electrode. The photoelectric conversion unit includes a p-type silicon layer, an n-type silicon layer, and an intrinsic type (i-type) silicon layer sandwiched between the p-type and n-type silicon layers. Several types of silicon films including microcrystalline silicon film ($\mu$c-Si), amorphous silicon film (a-Si), polycrystalline silicon film (poly-Si), and the like may be utilized to form the p-type, n-type, and/or i-type layers of the photoelectric conversion unit. The backside electrode may contain one or more conductive layers.

With traditional energy source prices on the rise, there is a need for a low cost way of producing electricity using a low cost solar cell device. Conventional solar cell manufacturing processes are highly labor intensive and have numerous interruptions that can affect production line throughput, solar cell cost, and device yield. Typical solar cell qualification and testing devices utilize lamps that are configured to expose a substrate to a beam of light. The lamps are positioned above the substrate and configured to shine a beam of light downwardly toward the horizontally positioned substrate. As the demand for using increasingly larger substrates continues to grow, the floor space required for such testing and qualification hardware in solar cell fabrication facilities becomes problematic due to maintenance and cost of ownership (e.g., floor space) issues.

Therefore, there is a need for an automated solar simulator that provides for easy maintenance, while reducing the amount of floor space required in solar cell fabrication facilities.

SUMMARY OF THE INVENTION

In one embodiment of the present invention, a solar simulator module comprises an enclosure defining a testing region of the module, an automation device configured to horizontally translate a solar cell structure into the testing region, an alignment mechanism disposed within the testing region configured to horizontally locate the solar cell structure, a robot having a gantry with support elements configured to grasp and hold the solar cell structure and a rotary actuator configured to rotate the gantry from a substantially horizontal orientation to a substantially vertical orientation, a probe nest positioned to make electrical connection with junction leads from the solar cells structure, and a light source configured to emit a flash of light simulating the solar spectrum substantially horizontally toward the vertically oriented solar cell structure.

In another embodiment, a process for testing a solar cell structure comprises transferring the solar cell structure into an enclosure defining a testing region therein, horizontally positioning the solar cell structure within the testing region, grasping the solar cell structure with a positioning robot, rotating the solar cell structure from a substantially horizontal position to a substantially vertical position, electrically connecting the solar cell structure to a probe nest, emitting a flash of light simulating the solar spectrum in a substantially horizontal orientation toward the vertically oriented solar cell structure, measuring the electrical characteristics of the solar cell structure, rotating the solar cell structure from the substantially vertical position to the substantially horizontal position, releasing the solar cell structure, and transferring the solar cell structure out of the enclosure.

In another embodiment, a solar simulator module comprises an enclosure having a top, walls, and a retractable bottom defining a testing region of the module, wherein at least one wall of the enclosure has a slit formed therethrough sized for transferring a solar cell structure therethrough, a roller guide configured to guide an edge of the solar cell structure into the testing region, an automation device in communication with an alignment mechanism configured to longitudinally position a plurality of solar cell structures within the testing region, a plurality of locating member configured to laterally translate the plurality of solar cell structures within the testing region, a robot disposed within the enclosure, wherein the robot comprises a gantry having a plurality of support elements disposed thereon and configured to grasp the plurality of solar cell structures and a rotary actuator configured to rotate the gantry from a substantially horizontal orientation to a substantially vertical orientation, a plurality of probe nests, each positioned to make electrical contact with one of the plurality of solar cell structures, wherein at least one of the probe nests is laterally positionable, a light source configured to emit a flash of light simulating the solar spectrum substantially horizontally toward the vertically oriented solar cell structures.

In yet another embodiment of the present invention, a solar cell device processing system comprises an automation device positioned to receive a horizontally oriented solar cell device from a junction box attachment module of the processing system and transfer the solar cell device through a slit in a wall of an enclosure and into a testing area defined within the enclosure, an alignment mechanism in communication with the automation device for horizontally positioning the solar cell device within the testing area, a positioning robot disposed within the testing area, wherein the robot comprises a gantry with support elements attached thereto and configured to grasp and hold the solar cell device and a rotary actuator for rotating the gantry from a substantially horizontal position to a substantially vertical position, a probe nest positioned to make electrical connection with junction leads from the solar cell device when the gantry is in the substantially vertical position, a light source configured to emit a flash of light simulating the solar spectrum substantially horizontally toward the vertically oriented solar cell device, and an automated labeling mechanism configured to affix a label to a back surface of the solar cell device.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
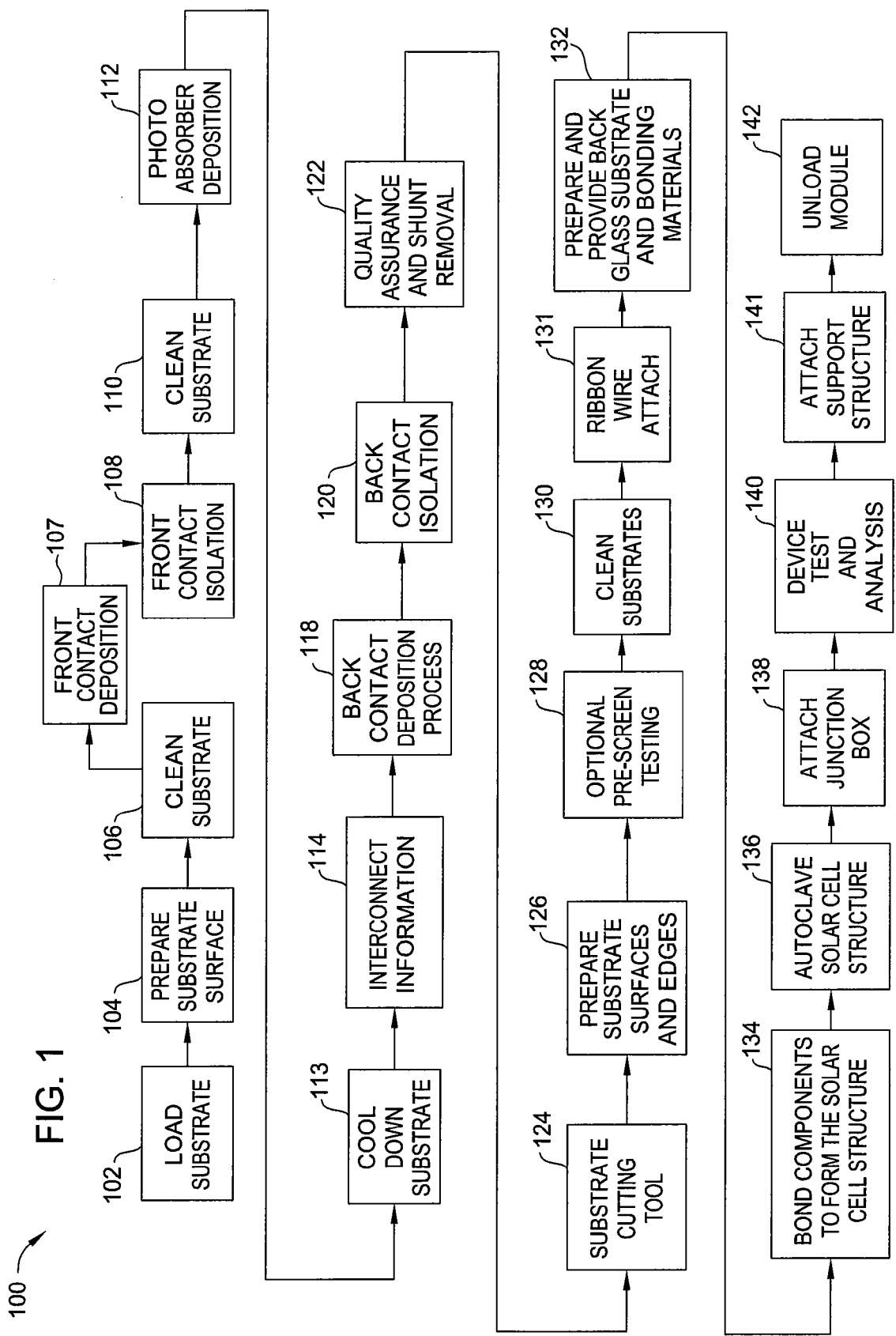
FIG. 1 illustrates a process sequence for forming a solar cell device according to one embodiment described herein.

Embodiments of the present invention generally relate to a solar simulator module positioned within a system for forming solar cell devices using a plurality of processing modules. In one embodiment, the system is adapted to form thin film solar cell devices by accepting a large unprocessed substrate and performing multiple deposition, material removal, cleaning, sectioning, bonding, and testing processes to form multiple complete, functional, and tested solar cell devices that can then be shipped to an end user for installation in a desired location to generate electricity.

The system is generally an arrangement of automated processing modules and automation equipment used to form solar cell devices that are interconnected by an automated material handling system. In one embodiment, the system is a fully automated solar cell device production line that is designed to reduce and/or remove the need for human interaction and/or labor intensive processing steps to improve the solar cell device reliability, process repeatability, and the cost of ownership of the formation process.

In one configuration, the system is adapted to form functionally tested thin film solar cell devices from a single large substrate. In one embodiment, the system comprises a substrate receiving module adapted to accept an incoming substrate, one or more absorbing layer deposition cluster tools having at least one processing chamber adapted to deposit a silicon-containing layer on a processing surface of the substrate, one or more back contact deposition chambers adapted to deposit a back contact layer on the processing surface of the substrate, one or more material removal chambers adapted to remove material from the processing surface of each substrate, one or more sectioning modules to section the processed substrate into multiple smaller processed substrates, a solar cell encapsulation device, an autoclave module adapted to heat and expose a composite solar cell structure to a pressure greater than atmospheric pressure, a junction box attaching region to attach a connection element that allows the solar cells to be connected to external components, and one or more quality assurance modules adapted to test and qualify each completely formed solar cell device. In one embodiment, the one or more quality assurance modules include a horizontally oriented solar simulator for testing fully formed solar cell devices positioned in a vertical orientation.

While the formation of silicon thin film solar cell devices is primarily described herein, this configuration is not intended to be limiting to the scope of the invention since the apparatus and methods disclosed herein can also be used to form, test, and analyze other types of solar cell devices, such as III-V type solar cells, thin film chalcogenide solar cells (e.g., CIGS, CdTe cells), amorphous or nanocrystalline silicon solar cells, photochemical type solar cells (e.g., dye sensitized), crystalline silicon solar cells, organic type solar cells, or other similar solar cell devices.

Figure 2:
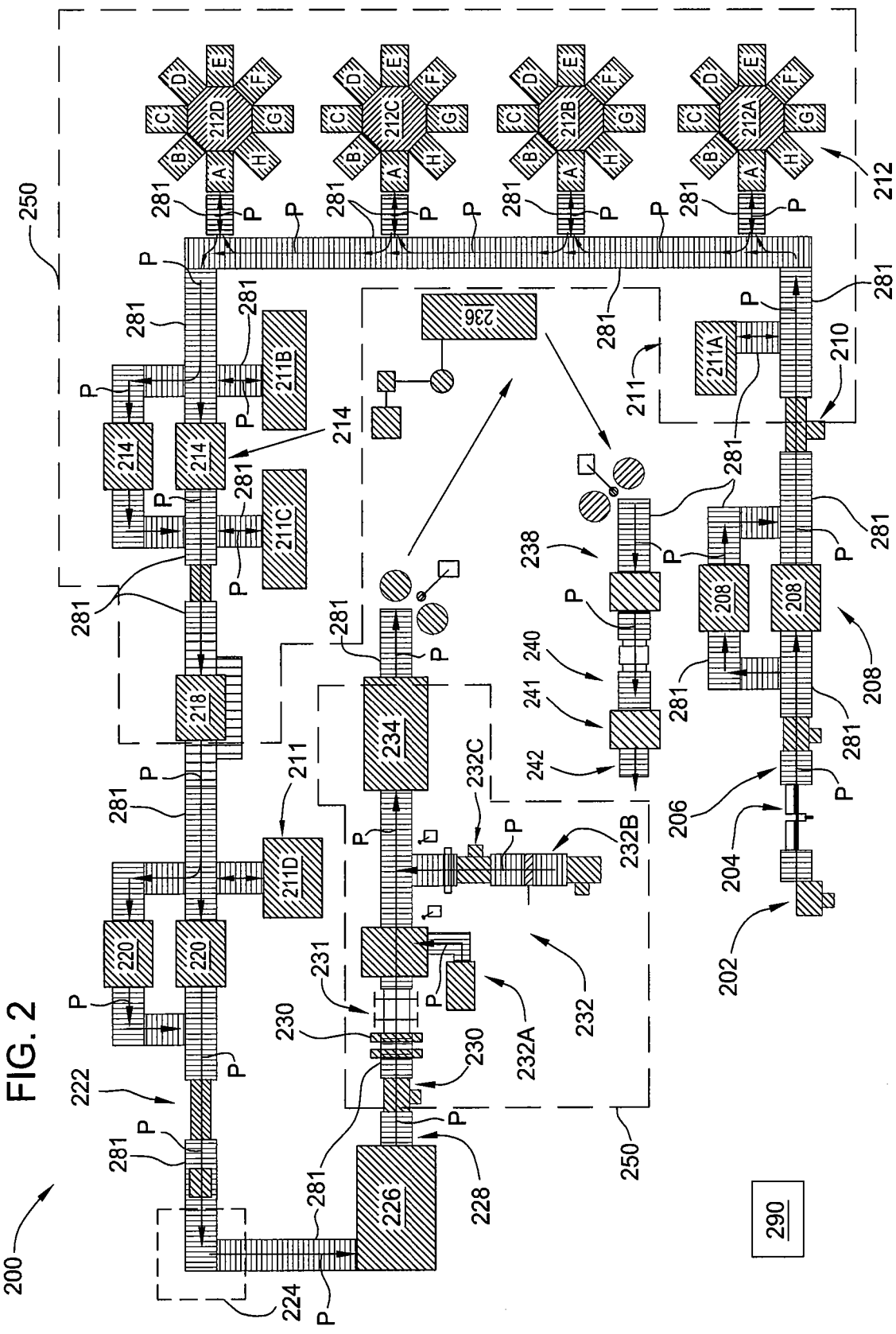
FIG. 2 illustrates a plan view of a solar cell production line according to one embodiment described herein.

FIG. 1 illustrates one embodiment of a process sequence 100 that contains a plurality of steps (i.e., steps 102-142) that are each used to form a solar cell device using a novel solar cell production line 200 described herein. The configuration, number of processing steps, and order of the processing steps in the process sequence 100 is not intended to be limiting to the scope of the invention described herein. FIG. 2 is a plan view of one embodiment of the production line 200, which is intended to illustrate some of the typical processing modules and process flows through the system and other related aspects of the system design, and is thus not intended to be limiting to the scope of the invention described herein.

A system controller 290 may be used to control one or more components found in the solar cell production line 200. The system controller 290 facilitates the control and automation of the overall solar cell production line 200 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and support hardware (e.g., sensors, robots, motors, lamps, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like.

A program (or computer instructions) readable by the system controller 290 determines which tasks are performable on a substrate. Preferably, the program is software readable by the system controller 290 that includes code to perform tasks relating to monitoring, moving, supporting, and/or positioning of a substrate along with various process recipe tasks and various chamber process recipe steps performed in the solar cell production line 200. In one embodiment, the system controller 290 also contains a plurality of programmable logic controllers (PLC's) that are used to locally control one or more modules in the solar cell production and a material handling system controller (e.g., PLC or standard computer) that deals with the higher level strategic moving, scheduling, and running of the complete solar cell production line.

Figure 3A:
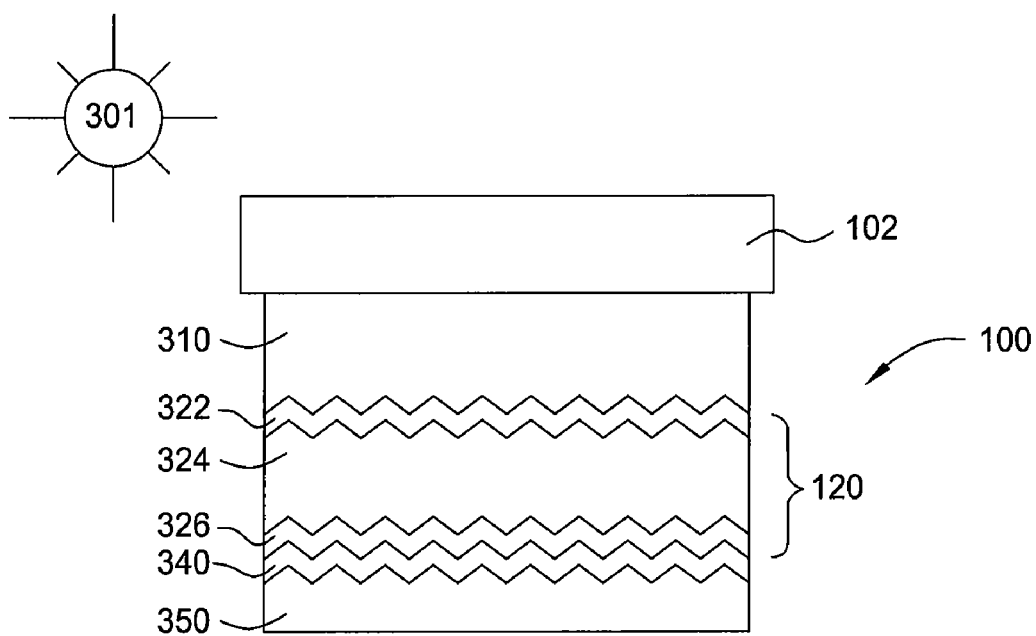
FIG. 3A is a side cross-sectional view of a thin film solar cell device according to one embodiment described herein.

Examples of a solar cell 300 that can be formed and tested using the process sequences illustrated in FIG. 1 and the components illustrated in the solar cell production line 200 are illustrated in FIGS. 3A-3E. FIG. 3A is a simplified schematic diagram of a single junction amorphous or micro-crystalline silicon solar cell 300 that can be formed and analyzed in the system described below.

As shown in FIG. 3A, the single junction amorphous or micro-crystalline silicon solar cell 300 is oriented toward a light source or solar radiation 301. The solar cell 300 generally comprises a substrate 302, such as a glass substrate, polymer substrate, metal substrate, or other suitable substrate, with thin films formed thereover. In one embodiment, the substrate 302 is a glass substrate that is about 2200 mm×2600 mm×3 mm in size. The solar cell 300 further comprises a first transparent conducting oxide (TCO) layer 310 (e.g., zinc oxide (ZnO), tin oxide (SnO)) formed over the substrate 302, a first p-i-n junction 320 formed over the first TCO layer 310, a second TCO layer 340 formed over the first p-i-n junction 320, and a back contact layer 350 formed over the second TCO layer 340. To improve light absorption by enhancing light trapping, the substrate and/or one or more of the thin films formed thereover may be optionally textured by wet, plasma, ion, and/or mechanical processes. For example, in the embodiment shown in FIG. 3A, the first TCO layer 310 is textured, and the subsequent thin films deposited thereover generally follow the topography of the surface below it.

In one configuration, the first p-i-n junction 320 may comprise a p-type amorphous silicon layer 322, an intrinsic type amorphous silicon layer 324 formed over the p-type amorphous silicon layer 322, and an n-type microcrystalline silicon layer 326 formed over the intrinsic type amorphous silicon layer 324. In one example, the p-type amorphous silicon layer 322 may be formed to a thickness between about 60 Å and about 300 Å, the intrinsic type amorphous silicon layer 324 may be formed to a thickness between about 1,500 Å and about 3,500 Å, and the n-type microcrystalline silicon layer 326 may be formed to a thickness between about 100 Å and about 400 Å. The back contact layer 350 may include, but is not limited to, a material selected from the group consisting of Al, Ag, Ti, Cr, Au, Cu, Pt, alloys thereof, and combinations thereof.

Figure 3B:
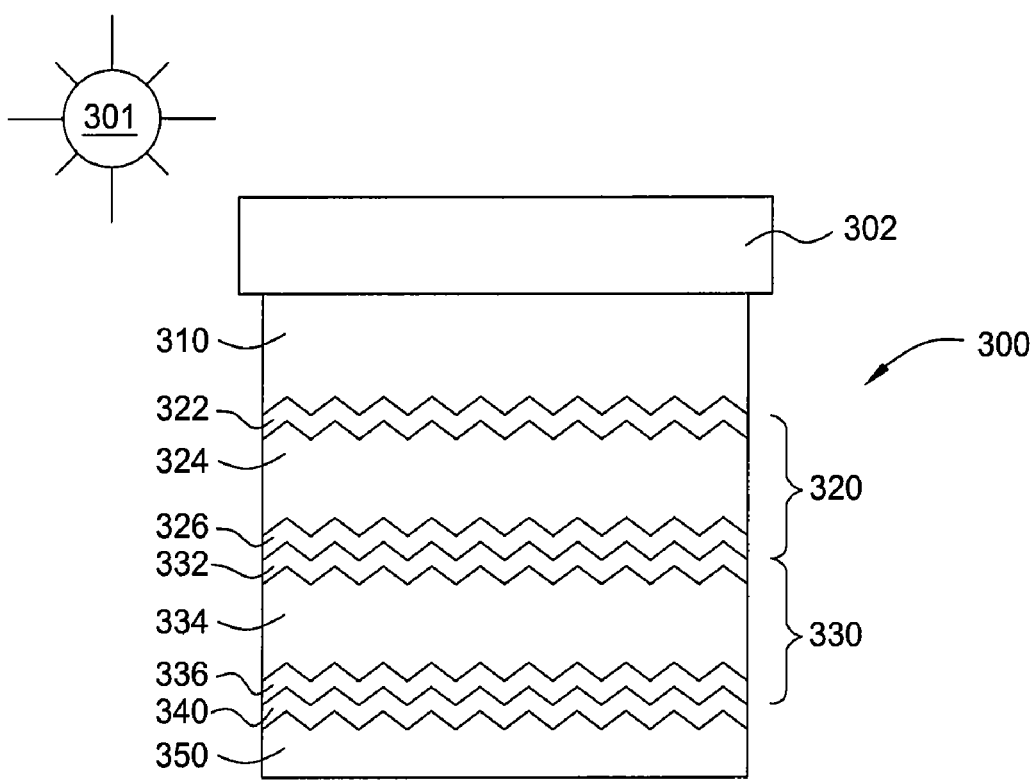
FIG. 3B is a side cross-sectional view of a thin film solar cell device according to one embodiment described herein.

FIG. 3B is a schematic diagram of an embodiment of a solar cell 300, which is a multi-junction solar cell that is oriented toward the light or solar radiation 301. The solar cell 300 comprises a substrate 302, such as a glass substrate, polymer substrate, metal substrate, or other suitable substrate, with thin films formed thereover. The solar cell 300 may further comprise a first transparent conducting oxide (TCO) layer 310 formed over the substrate 302, a first p-i-n junction 320 formed over the first TCO layer 310, a second p-i-n junction 330 formed over the first p-i-n junction 320, a second TCO layer 340 formed over the second p-i-n junction 330, and a back contact layer 350 formed over the second TCO layer 340.

In the embodiment shown in FIG. 3B, the first TCO layer 310 is textured, and the subsequent thin films deposited thereover generally follow the topography of the surface below it. The first p-i-n junction 320 may comprise a p-type amorphous silicon layer 322, an intrinsic type amorphous silicon layer 324 formed over the p-type amorphous silicon layer 322, and an n-type microcrystalline silicon layer 326 formed over the intrinsic type amorphous silicon layer 324. In one example, the p-type amorphous silicon layer 322 may be formed to a thickness between about 60 Å and about 300 Å, the intrinsic type amorphous silicon layer 324 may be formed to a thickness between about 1,500 Å and about 3,500 Å, and the n-type microcrystalline silicon layer 326 may be formed to a thickness between about 100 Å and about 400 Å.

The second p-i-n junction 330 may comprise a p-type microcrystalline silicon layer 332, an intrinsic type microcrystalline silicon layer 334 formed over the p-type microcrystalline silicon layer 332, and an n-type amorphous silicon layer 336 formed over the intrinsic type microcrystalline silicon layer 334. In one example, the p-type microcrystalline silicon layer 332 may be formed to a thickness between about 100 Å and about 400 Å, the intrinsic type microcrystalline silicon layer 334 may be formed to a thickness between about 10,000 Å and about 30,000 Å, and the n-type amorphous silicon layer 336 may be formed to a thickness between about 100 Å and about 500 Å. The back contact layer 350 may include, but is not limited to a material selected from the group consisting of Al, Ag, Ti, Cr, Au, Cu, Pt, alloys thereof, and combinations thereof.

Figure 3C:
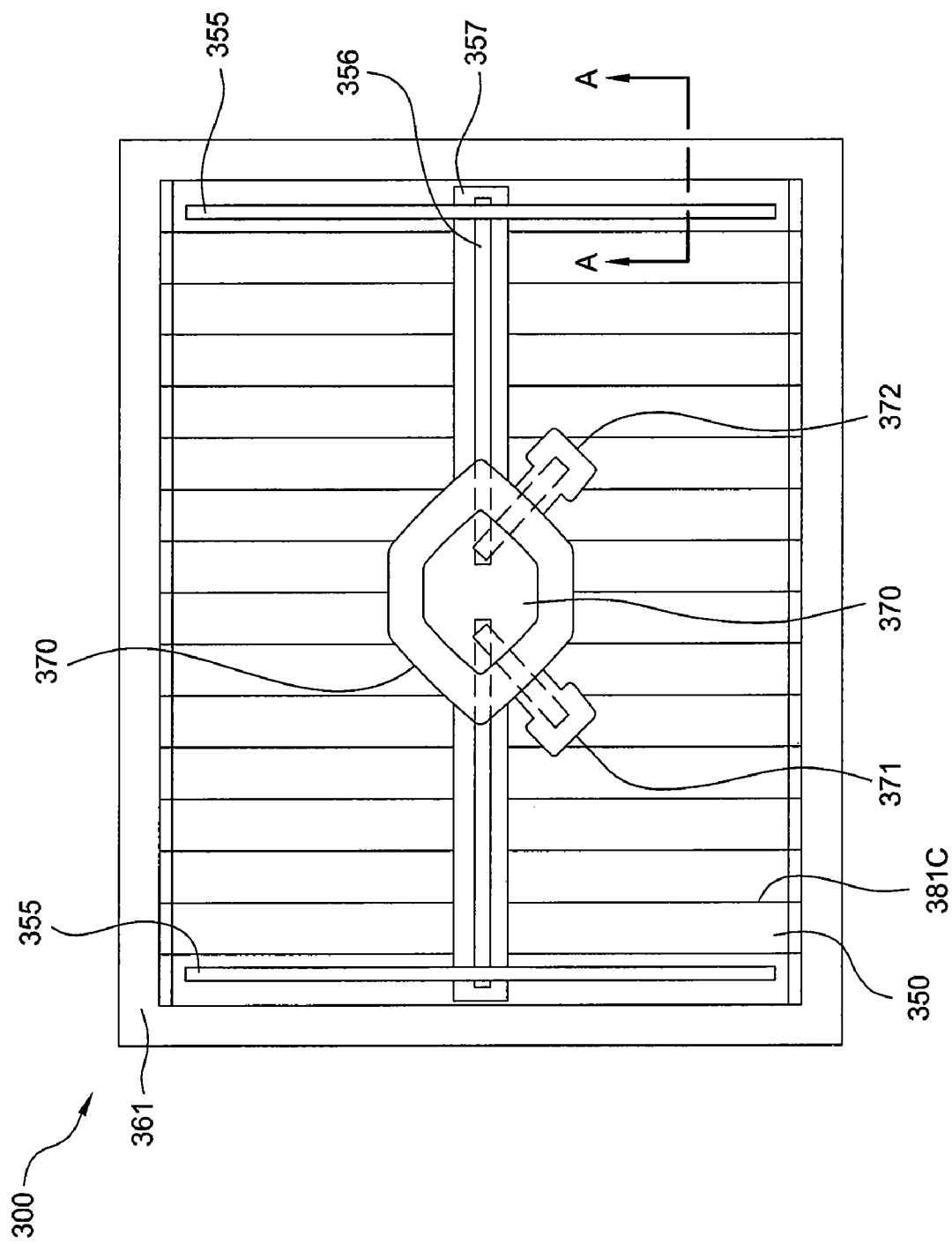
FIG. 3C is a plan view of a composite solar cell structure according to one embodiment described herein.
Figure 3D:
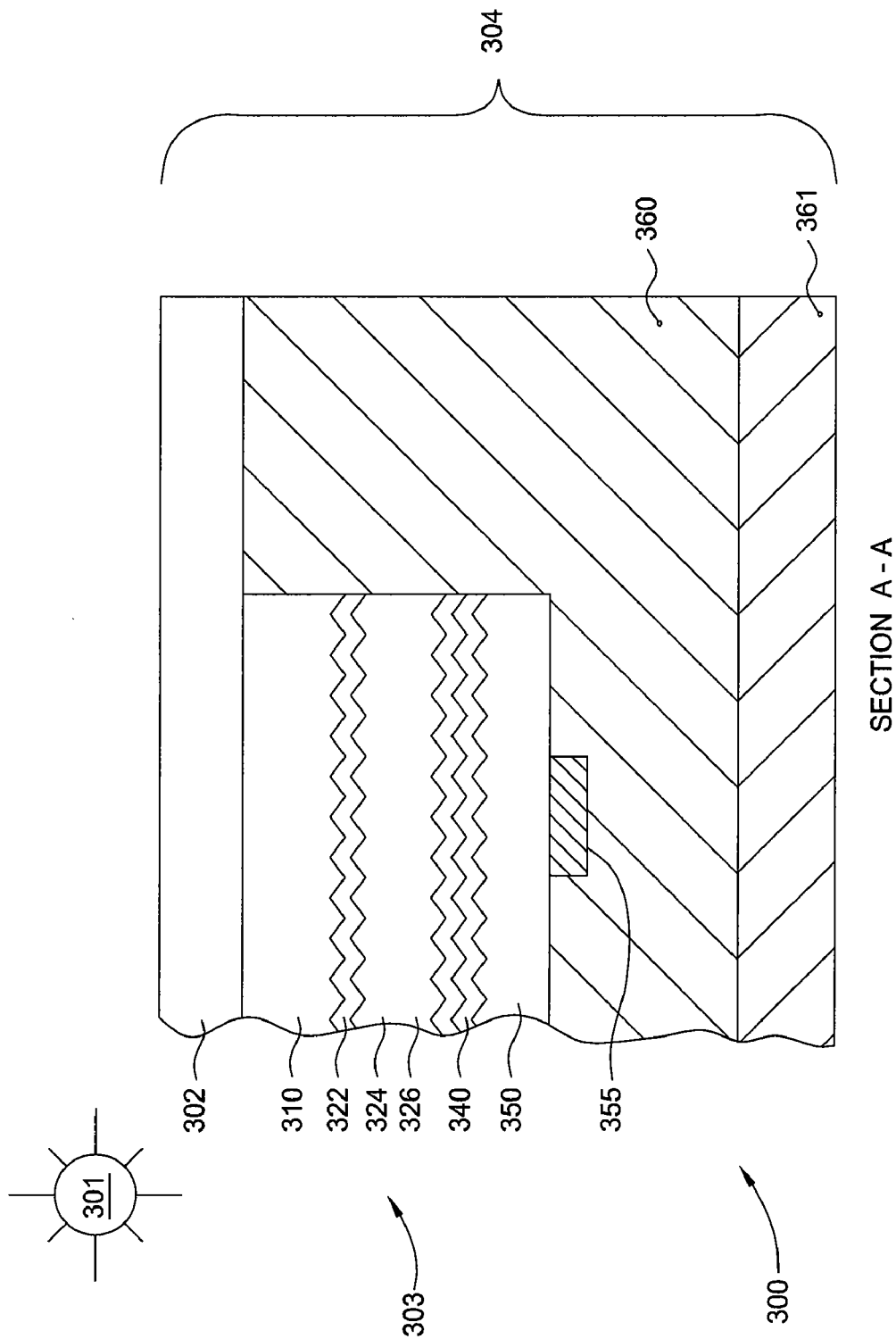
FIG. 3D is a side cross-sectional view along Section A-A of FIG. 3C.

FIG. 3C is a plan view that schematically illustrates an example of the rear surface of a formed solar cell 300 that has been produced and tested in the production line 200. FIG. 3D is a side cross-sectional view of a portion of the solar cell 300 illustrated in FIG. 3C (see section A-A). While FIG. 3D illustrates the cross-section of a single junction cell similar to the configuration described in FIG. 3A, this is not intended to be limiting as to the scope of the invention described herein.

As shown in FIGS. 3C and 3D, the solar cell 300 may contain a substrate 302, the solar cell device elements (e.g., reference numerals 310-350), one or more internal electrical connections (e.g., side buss 355, cross-buss 356), a layer of bonding material 360, a back glass substrate 361, and a junction box 370. The junction box 370 may generally contain two junction box terminals 371, 372 that are electrically connected to portions of the solar cell 300 through the side buss 355 and the cross-buss 356, which are in electrical communication with the back contact layer 350 and active regions of the solar cell 300. To avoid confusion relating to the actions specifically performed on the substrates 302 in the discussion below, a substrate 302 having one or more of the deposited layers (e.g., reference numerals 310-350) and/or one or more internal electrical connections (e.g., side buss 355, cross-buss 356) disposed thereon is generally referred to as a device substrate 303. Similarly, a device substrate 303 that has been bonded to a back glass substrate 361 using a bonding material 360 is referred to as a composite solar cell structure 304.

Figure 3E:
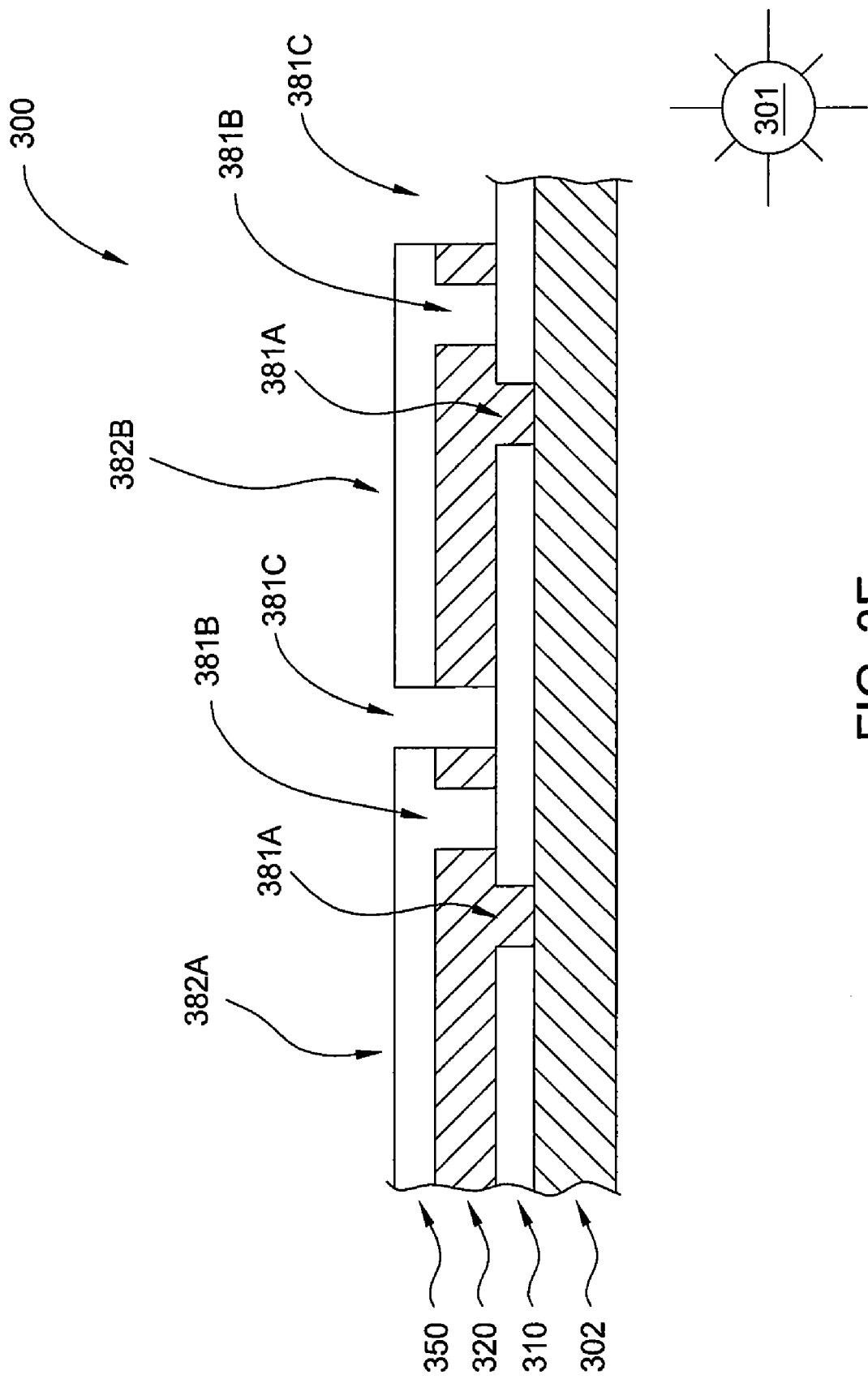
FIG. 3E is a side cross-sectional view of a thin film solar cell device according to one embodiment described herein.

FIG. 3E is a schematic cross-section of a solar cell 300 illustrating various scribed regions used to form the individual cells 382A-382B within the solar cell 300. As illustrated in FIG. 3E, the solar cell 300 includes a transparent substrate 302, a first TCO layer 310, a first p-i-n junction 320, and a back contact layer 350. Three laser scribing steps may be performed to produce trenches 381A, 381B, and 381C, which are generally required to form a high efficiency solar cell device. Although formed together on the substrate 302, the individual cells 382A and 382B are isolated from each other by the insulating trench 381C formed in the back contact layer 350 and the first p-i-n junction 320. In addition, the trench 381B is formed in the first p-i-n junction 320 so that the back contact layer 350 is in electrical contact with the first TCO layer 310. In one embodiment, the insulating trench 381A is formed by the laser scribe removal of a portion of the first TCO layer 310 prior to the deposition of the first p-i-n junction 320 and the back contact layer 350. Similarly, in one embodiment, the trench 381B is formed in the first p-i-n junction 320 by the laser scribe removal of a portion of the first p-i-n junction 320 prior to the deposition of the back contact layer 350. While a single junction type solar cell is illustrated in FIG. 3E this configuration is not intended to be limiting to the scope of the invention described herein.

General Solar Cell Formation Process Sequence

Referring to FIGS. 1 and 2, the process sequence 100 generally starts at step 102 in which a substrate 302 is loaded into the loading module 202 found in the solar cell production line 200. In one embodiment, the substrates 302 are received in a "raw" state where the edges, overall size, and/or cleanliness of the substrates 302 are not well controlled. Receiving "raw" substrates 302 reduces the cost to prepare and store substrates 302 prior to forming a solar device and thus reduces the solar cell device cost, facilities costs, and production costs of the finally formed solar cell device. However, typically, it is advantageous to receive "raw" substrates 302 that have a transparent conducting oxide (TCO) layer (e.g., first TCO layer 310) already deposited on a surface of the substrate 302 before it is received into the system in step 102. If a conductive layer, such as TCO layer, is not deposited on the surface of the "raw" substrates then a front contact deposition step (step 107), which is discussed below, needs to be performed on a surface of the substrate 302.

In one embodiment, the substrates 302 or 303 are loaded into the solar cell production line 200 in a sequential fashion, and thus do not use a cassette or batch style substrate loading system. A cassette style and/or batch loading type system that requires the substrates to be un-loaded from the cassette, processed, and then returned to the cassette before moving to the next step in the process sequence can be time consuming and decrease the solar cell production line throughput. The use of batch processing does not facilitate certain embodiments of the present invention, such as fabricating multiple solar cell devices from a single substrate. Additionally, the use of a batch style process sequence generally prevents the use of an asynchronous flow of substrates through the production line, which may provide improved substrate throughput during steady state processing and when one or more modules are brought down for maintenance or due to a fault condition. Generally, batch or cassette based schemes are not able to achieve the throughput of the production line described herein, when one or more processing modules are brought down for maintenance, or even during normal operation, since the queuing and loading of substrates can require a significant amount of overhead time.

In the next step, step 104, the surfaces of the substrate 302 are prepared to prevent yield issues later on in the process. In one embodiment of step 104, the substrate is inserted into a front end substrate seaming module 204 that is used to prepare the edges of the substrate 302 or 303 to reduce the likelihood of damage, such as chipping or particle generation from occurring during the subsequent processes. Damage to the substrate 302 or 303 can affect device yield and the cost to produce a usable solar cell device. In one embodiment, the front end seaming module 204 is used to round or bevel the edges of the substrate 302 or 303. In one embodiment, a diamond impregnated belt or disc is used to grind the material from the edges of the substrate 302 or 303. In another embodiment, a grinding wheel, grit blasting, or laser ablation technique is used to remove the material from the edges of the substrate 302 or 303.

Next the substrate 302 or 303 is transported to the cleaning module 206, in which step 106, or a substrate cleaning step, is performed on the substrate 302 or 303 to remove any contaminants found on the surface of thereof. Common contaminants may include materials deposited on the substrate 302 or 303 during the substrate forming process (e.g., glass manufacturing process) and/or during shipping or storing of the substrates 302 or 303. Typically, the cleaning module 206 uses wet chemical scrubbing and rinsing steps to remove any undesirable contaminants.

In one example, the process of cleaning the substrate 302 or 303 may occur as follows. First, the substrate 302 or 303 enters a contaminant removal section of the cleaning module 206 from either a transfer table or an automation device 281. In general, the system controller 290 establishes the timing for each substrate 302 or 303 that enters the cleaning module 206. The contaminant removal section may utilize dry cylindrical brushes in conjunction with a vacuum system to dislodge and extract contaminants from the surface of the substrate 302. Next, a conveyor within the cleaning module 206 transfers the substrate 302 or 303 to a pre-rinse section, where spray tubes dispense hot DI water at a temperature, for example, of 50° C. from a DI water heater onto a surface of the substrate 302 or 303. Commonly, since the device substrate 303 has a TCO layer disposed thereon, and since TCO layers are generally electron absorbing materials, DI water is used to avoid any traces of possible contamination and ionizing of the TCO layer. Next, the rinsed substrate 302, 303 enters a wash section. In the wash section, the substrate 302 or 303 is wet-cleaned with a brush (e.g., perlon) and hot water. In some cases a detergent (e.g., Alconox™, Citrajet™, Detojet™, Transene™, and Basic H™), surfactant, pH adjusting agent, and other cleaning chemistries are used to clean and remove unwanted contaminants and particles from the substrate surface. A water re-circulation system recycles the hot water flow. Next, in a final rinse section of the cleaning module 206, the substrate 302 or 303 is rinsed with water at ambient temperature to remove any traces of contaminants. Finally, in a drying section, an air blower is used to dry the substrate 302 or 303 with hot air. In one configuration a deionization bar is used to remove the electrical charge from the substrate 302 or 303 at the completion of the drying process.

In the next step, or step 108, separate cells are electrically isolated from one another via scribing processes. Contamination particles on the TCO surface and/or on the bare glass surface can interfere with the scribing procedure. In laser scribing, for example, if the laser beam runs across a particle, it may be unable to scribe a continuous line, resulting in a short circuit between cells. In addition, any particulate debris present in the scribed pattern and/or on the TCO of the cells after scribing can cause shunting and non-uniformities between layers. Therefore, a well-defined and well-maintained process is generally needed to ensure that contamination is removed throughout the production process. In one embodiment, the cleaning module 206 is available from the Energy and Environment Solutions division of Applied Materials in Santa Clara, Calif.

Referring to FIGS. 1 and 2, in one embodiment, prior to performing step 108 the substrates 302 are transported to a front end processing module (not illustrated in FIG. 2) in which a front contact formation process, or step 107, is performed on the substrate 302. In one embodiment, the front end processing module is similar to the processing module 218 discussed below. In step 107, the one or more substrate front contact formation steps may include one or more preparation, etching, and/or material deposition steps to form the front contact regions on a bare solar cell substrate 302. In one embodiment, step 107 comprises one or more PVD steps that are used to form the front contact region on a surface of the substrate 302. In one embodiment, the front contact region contains a transparent conducting oxide (TCO) layer that may contain metal element selected from a group consisting of zinc (Zn), aluminum (Al), indium (In), and tin (Sn). In one example, a zinc oxide (ZnO) is used to form at least a portion of the front contact layer. In one embodiment, the front end processing module is an ATON™ PVD 5.7 tool available from Applied Materials in Santa Clara, Calif. in which one or more processing steps are performed to deposit the front contact region. In another embodiment, one or more CVD steps are used to form the front contact region on a surface of the substrate 302.

Next the device substrate 303 is transported to the scribe module 208 in which step 108, or a front contact isolation step, is performed on the device substrate 303 to electrically isolate different regions of the device substrate 303 surface from each other. In step 108, material is removed from the device substrate 303 surface by use of a material removal step, such as a laser ablation process. The success criteria for step 108 are to achieve good cell-to-cell and cell-to-edge isolation while minimizing the scribe area.

In one embodiment, a Nd:vanadate (Nd:YVO$_4$) laser source is used ablate material from the device substrate 303 surface to form lines that electrically isolate one region of the device substrate 303 from the next. In one embodiment, the laser scribe process performed during step 108 uses a 1064 nm wavelength pulsed laser to pattern the material disposed on the substrate 302 to isolate each of the individual cells (e.g., reference cells 382A and 382B) that make up the solar cell 300. In one embodiment, a 5.7 m$^2$ substrate laser scribe module available from Applied Materials, Inc. of Santa Clara, Calif. is used to provide simple reliable optics and substrate motion for accurate electrical isolation of regions of the device substrate 303 surface. In another embodiment, a water jet cutting tool or diamond scribe is used to isolate the various regions on the surface of the device substrate 303.

It may be desirable to assure that the temperature of the device substrates 303 entering the scribe module 208 are at a temperature in a range between about 20° C. and about 26° C. by use of an active temperature control hardware assembly that may contain a resistive heater and/or chiller components (e.g., heat exchanger, thermoelectric device). In one embodiment, it is desirable to control the device substrate 303 temperature to about 25+/−0.5° C.

Next the device substrate 303 is transported to the cleaning module 210 in which step 110, or a pre-deposition substrate cleaning step, is performed on the device substrate 303 to remove any contaminants found on the surface of the device substrate 303 after performing the cell isolation step (step 108). Typically, the cleaning module 210 uses wet chemical scrubbing and rinsing steps to remove any undesirable contaminants found on the device substrate 303 surface after performing the cell isolation step. In one embodiment, a cleaning process similar to the processes described in step 106 above is performed on the device substrate 303 to remove any contaminants on the surface(s) of the device substrate 303.

Next, the device substrate 303 is transported to the processing module 212 in which step 112, which comprises one or more photoabsorber deposition steps, is performed on the device substrate 303. In step 112, the one or more photoabsorber deposition steps may include one or more preparation, etching, and/or material deposition steps that are used to form the various regions of the solar cell device. Step 112 generally comprises a series of sub-processing steps that are used to form one or more p-i-n junctions. In one embodiment, the one or more p-i-n junctions comprise amorphous silicon and/or microcrystalline silicon materials. In general, the one or more processing steps are performed in one or more cluster tools (e.g., cluster tools 212A-212D) found in the processing module 212 to form one or more layers in the solar cell device formed on the device substrate 303. In one embodiment, the device substrate 303 is transferred to an accumulator 211A prior to being transferred to one or more of the cluster tools 212A-212D. In one embodiment, in cases where the solar cell device is formed to include multiple junctions, such as the tandem junction solar cell 300 illustrated in FIG. 3B, the cluster tool 212A in the processing module 212 is adapted to form the first p-i-n junction 320 and cluster tools 212B-212D are configured to form the second p-i-n junction 330.

In one embodiment of the process sequence 100, a cool down step, or step 113, is performed after step 112 has been performed. The cool down step is generally used to stabilize the temperature of the device substrate 303 to assure that the processing conditions seen by each device substrate 303 in the subsequent processing steps are repeatable. Generally, the temperature of the device substrate 303 exiting the processing module 212 could vary by many degrees Celsius and exceed a temperature of 50° C., which can cause variability in the subsequent processing steps and solar cell performance.

In one embodiment, the cool down step 113 is performed in one or more of the substrate supporting positions found in one or more accumulators 211. In one configuration of the production line, as shown in FIG. 2, the processed device substrates 303 may be positioned in one of the accumulators 211B for a desired period of time to control the temperature of the device substrate 303. In one embodiment, the system controller 290 is used to control the positioning, timing, and movement of the device substrates 303 through the accumulator(s) 211 to control the temperature of the device substrates 303 before proceeding down stream through the production line.

Next, the device substrate 303 is transported to the scribe module 214 in which step 114, or the interconnect formation step, is performed on the device substrate 303 to electrically isolate various regions of the device substrate 303 surface from each other. In step 114, material is removed from the device substrate 303 surface by use of a material removal step, such as a laser ablation process. In one embodiment, an Nd:vanadate (Nd:YVO$_4$) laser source is used ablate material from the substrate surface to form lines that electrically isolate one solar cell from the next. In one embodiment, a 5.7 m$^2$ substrate laser scribe module available from Applied Materials, Inc. is used to perform the accurate scribing process. In one embodiment, the laser scribe process performed during step 108 uses a 532 nm wavelength pulsed laser to pattern the material disposed on the device substrate 303 to isolate the individual cells that make up the solar cell 300. As shown in FIG. 3E, in one embodiment, the trench 381B is formed in the first p-i-n junction 320 layers by use of a laser scribing process. In another embodiment, a water jet cutting tool or diamond scribe is used to isolate the various regions on the surface of the solar cell.

It may be desirable to assure that the temperature of the device substrates 303 entering the scribe module 214 are at a temperature in a range between about 20° C. and about 26° C. by use of an active temperature control hardware assembly that may contain a resistive heater and/or chiller components (e.g., heat exchanger, thermoelectric device). In one embodiment, it is desirable to control the substrate temperature to about 25+/−0.5° C.

In one embodiment, the solar cell production line 200 has at least one accumulator 211 positioned after the scribe module(s) 214. During production accumulators 211C may be used to provide a ready supply of substrates to the processing module 218, and/or provide a collection area where substrates coming from the processing module 212 can be stored if the processing module 218 goes down or can not keep up with the throughput of the scribe module(s) 214. In one embodiment it is generally desirable to monitor and/or actively control the temperature of the substrates exiting the accumulators 211C to assure that the results of the back contact formation step 120 are repeatable. In one aspect, it is desirable to assure that the temperature of the substrates exiting the accumulators 211C or arriving at the processing module 218 are at a temperature in a range between about 20° C. and about 26° C. In one embodiment, it is desirable to control the substrate temperature to about 25+/−0.5° C. In one embodiment, it is desirable to position one or more accumulators 211C that are able to retain at least about 80 substrates.

Next, the device substrate 303 is transported to the processing module 218 in which one or more substrate back contact formation steps, or step 118, are performed on the device substrate 303. In step 118, the one or more substrate back contact formation steps may include one or more preparation, etching, and/or material deposition steps that are used to form the back contact regions of the solar cell device. In one embodiment, step 118 generally comprises one or more PVD steps that are used to form the back contact layer 350 on the surface of the device substrate 303. In one embodiment, the one or more PVD steps are used to form a back contact region that contains a metal layer selected from a group consisting of zinc (Zn), tin (Sn), aluminum (Al), copper (Cu), silver (Ag), nickel (Ni), and vanadium (V). In one example, a zinc oxide (ZnO) or nickel vanadium alloy (NiV) is used to form at least a portion of the back contact layer 305. In one embodiment, the one or more processing steps are performed using an ATON™ PVD 5.7 tool available from Applied Materials in Santa Clara, Calif. In another embodiment, one or more CVD steps are used to form the back contact layer 350 on the surface of the device substrate 303.

In one embodiment, the solar cell production line 200 has at least one accumulator 211 positioned after the processing module 218. During production, the accumulators 211D may be used to provide a ready supply of substrates to the scribe modules 220, and/or provide a collection area where substrates coming from the processing module 218 can be stored if the scribe modules 220 go down or can not keep up with the throughput of the processing module 218. In one embodiment it is generally desirable to monitor and/or actively control the temperature of the substrates exiting the accumulators 211D to assure that the results of the back contact formation step 120 are repeatable. In one aspect, it is desirable to assure that the temperature of the substrates exiting the accumulators 211D or arriving at the scribe module 220 are at a temperature in a range between about 20° C. and about 26° C. In one embodiment, it is desirable to control the substrate tempera-ture to about 25+/−0.5° C. In one embodiment, it is desirable to position one or more accumulators 211C that are able to retain at least about 80 substrates.

Next, the device substrate 303 is transported to the scribe module 220 in which step 120, or a back contact isolation step, is performed on the device substrate 303 to electrically isolate the plurality of solar cells contained on the substrate surface from each other. In step 120, material is removed from the substrate surface by use of a material removal step, such as a laser ablation process. In one embodiment, a Nd:vanadate (Nd:YVO$_4$) laser source is used ablate material from the device substrate 303 surface to form lines that electrically isolate one solar cell from the next. In one embodiment, a 5.7 m$^2$ substrate laser scribe module, available from Applied Materials, Inc., is used to accurately scribe the desired regions of the device substrate 303. In one embodiment, the laser scribe process performed during step 120 uses a 532 nm wavelength pulsed laser to pattern the material disposed on the device substrate 303 to isolate the individual cells that make up the solar cell 300. As shown in FIG. 3E, in one embodiment, the trench 381C is formed in the first p-i-n junction 320 and back contact layer 350 by use of a laser scribing process.

It may be desirable to assure that the temperature of the device substrates 303 entering the scribe module 220 are at a temperature in a range between about 20° C. and about 26° C. by use of an active temperature control hardware assembly that may contain a resistive heater and/or chiller components (e.g., heat exchanger, thermoelectric device). In one embodiment, it is desirable to control the substrate temperature to about 25+/−0.5° C.

Next, the device substrate 303 is transported to the quality assurance module 222 in which step 122, or quality assurance and/or shunt removal steps, are performed on the device substrate 303 to assure that the devices formed on the substrate surface meet a desired quality standard and in some cases correct defects in the formed device. In step 122, a probing device is used to measure the quality and material properties of the formed solar cell device by use of one or more substrate contacting probes.

In one embodiment, the quality assurance module 222 projects a low level of light at the p-i-n junction(s) of the solar cell and uses the one more probes to measure the output of the cell to determine the electrical characteristics of the formed solar cell device(s). If the module detects a defect in the formed device, it can take corrective actions to fix the defects in the formed solar cells on the device substrate 303. In one embodiment, if a short or other similar defect is found, it may be desirable to create a reverse bias between regions on the substrate surface to control and or correct one or more of the defectively formed regions of the solar cell device. During the correction process the reverse bias generally delivers a voltage high enough to cause the defects in the solar cells to be corrected. In one example, if a short is found between supposedly isolated regions of the device substrate 303 the magnitude of the reverse bias may be raised to a level that causes the conductive elements in areas between the isolated regions to change phase, decompose, or become altered in some way to eliminate or reduce the magnitude of the electrical short.

In one embodiment of the process sequence 100, the quality assurance module 222 and factory automation system are used together to resolve quality issues found in a formed device substrate 303 during the quality assurance testing. In one case, a device substrate 303 may be sent back upstream in the processing sequence to allow one or more of the fabrication steps to be re-performed on the device substrate 303 (e.g., back contact isolation step (step 120)) to correct one or more quality issues with the processed device substrate 303.

Next, the device substrate 303 is optionally transported to the substrate sectioning module 224 in which a substrate sectioning step 124 is used to cut the device substrate 303 into a plurality of smaller device substrates 303 to form a plurality of smaller solar cell devices. In one embodiment of step 124, the device substrate 303 is inserted into substrate sectioning module 224 that uses a CNC glass cutting tool to accurately cut and section the device substrate 303 to form solar cell devices that are a desired size. In one embodiment, the device substrate 303 is inserted into the cutting module 224 that uses a glass scribing tool to accurately score the surface of the device substrate 303. The device substrate 303 is then broken along the scored lines to produce the desired size and number of sections needed for the completion of the solar cell devices.

In one embodiment, steps 102-122 can be configured to use equipment that is adapted to perform process steps on large device substrates 303, such as 2200 mm×2600 mm×3 mm glass device substrates 303, and steps 124 onward can be adapted to fabricate various smaller sized solar cell devices with no additional equipment required. In another embodiment, step 124 is positioned in the process sequence 100 prior to step 122 so that the initially large device substrate 303 can be sectioned to form multiple individual solar cells that are then tested and characterized one at a time or as a group (i.e., two or more at a time). In this case, steps 102-121 are configured to use equipment that is adapted to perform process steps on large device substrates 303, such as 2200 mm×2600 mm×3 mm glass substrates, and steps 124 and 122 onward are adapted to fabricate various smaller sized modules with no additional equipment required.

Referring back to FIGS. 1 and 2, the device substrate 303 is next transported to the seamer/edge deletion module 226 in which a substrate surface and edge preparation step 126 is used to prepare various surfaces of the device substrate 303 to prevent yield issues later on in the process. In one embodiment of step 126, the device substrate 303 is inserted into seamer/edge deletion module 226 to prepare the edges of the device substrate 303 to shape and prepare the edges of the device substrate 303. Damage to the device substrate 303 edge can affect the device yield and the cost to produce a usable solar cell device. In another embodiment, the seamer/edge deletion module 226 is used to remove deposited material from the edge of the device substrate 303 (e.g., 10 mm) to provide a region that can be used to form a reliable seal between the device substrate 303 and the backside glass (i.e., steps 134-136 discussed below). Material removal from the edge of the device substrate 303 may also be useful to prevent electrical shorts in the final formed solar cell.

In one embodiment, a diamond impregnated belt is used to grind the deposited material from the edge regions of the device substrate 303. In another embodiment, a grinding wheel is used to grind the deposited material from the edge regions of the device substrate 303. In another embodiment, dual grinding wheels are used to remove the deposited material from the edge of the device substrate 303. In yet another embodiment, grit blasting or laser ablation techniques are used to remove the deposited material from the edge of the device substrate 303. In one aspect, the seamer/edge deletion module 226 is used to round or bevel the edges of the device substrate 303 by use of shaped grinding wheels, angled and aligned belt sanders, and/or abrasive wheels.

Next the device substrate 303 is transported to the pre-screen module 228 in which optional pre-screen steps 128 are performed on the device substrate 303 to assure that the devices formed on the substrate surface meet a desired quality standard. In step 128, a light emitting source and probing device are used to measure the output of the formed solar cell device by use of one or more substrate contacting probes. If the module 228 detects a defect in the formed device it can take corrective actions or the solar cell can be scrapped.

Next the device substrate 303 is transported to the cleaning module 230 in which step 130, or a pre-lamination substrate cleaning step, is performed on the device substrate 303 to remove any contaminants found on the surface of the substrates 303 after performing steps 122-128. Typically, the cleaning module 230 uses wet chemical scrubbing and rinsing steps to remove any undesirable contaminants found on the substrate surface after performing the cell isolation step. In one embodiment, a cleaning process similar to the processes described in step 106 is performed on the substrate 303 to remove any contaminants on the surface(s) of the substrate 303.

Next the substrate 303 is transported to a bonding wire attach module 231 in which step 131, or a bonding wire attach step, is performed on the substrate 303. Step 131 is used to attach the various wires/leads required to connect the various external electrical components to the formed solar cell device. Typically, the bonding wire attach module 231 is an automated wire bonding tool that reliably and quickly forms the numerous interconnects that are often required to form the large solar cells formed in the production line 200.

In one embodiment, the bonding wire attach module 231 is used to form the side-buss 355 (FIG. 3C) and cross-buss 356 on the formed back contact region (step 118). In this configuration the side-buss 355 may be a conductive material that can be affixed, bonded, and/or fused to the back contact layer 350 found in the back contact region to form a good electrical contact. In one embodiment, the side-buss 355 and cross-buss 356 each comprise a metal strip, such as copper tape, a nickel coated silver ribbon, a silver coated nickel ribbon, a tin coated copper ribbon, a nickel coated copper ribbon, or other conductive material that can carry the current delivered by the solar cell and be reliably bonded to the metal layer in the back contact region. In one embodiment, the metal strip is between about 2 mm and about 10 mm wide and between about 1 mm and about 3 mm thick.

The cross-buss 356, which is electrically connected to the side-buss 355 at the junctions, can be electrically isolated from the back contact layer(s) of the solar cell by use of an insulating material 357, such as an insulating tape. The ends of each of the cross-busses 356 generally have one or more leads that are used to connect the side-buss 355 and the cross-buss 356 to the electrical connections found in a junction box 370, which is used to connect the formed solar cell to the other external electrical components.

In the next step, step 132, a bonding material 360 (FIG. 3D) and "back glass" substrate 361 are prepared for delivery into the solar cell formation process (i.e., process sequence 100). The preparation process is performed in the glass lay-up module 232, which comprises a material preparation module 232A, a glass loading module 232B, and a glass cleaning module 232C. The back glass substrate 361 is bonded onto the device substrate 303 formed in steps 102-130 above by use of a laminating process (step 134 discussed below). In one embodiment of step 132, a polymeric material is prepared to be placed between the back glass substrate 361 and the deposited layers on the device substrate 303 to form a hermetic seal to prevent the environment from attacking the solar cell during its life.

Referring to FIG. 2, step 132 comprises a series of sub-steps in which a bonding material 360 is prepared in the material preparation module 232A, the bonding material 360 is then placed over the device substrate 303, the back glass substrate 361 is loaded into the loading module 232B and washed by the cleaning module 232C, and the back glass substrate 361 is then placed over the bonding material 360 and the device substrate 303.

In one embodiment, the material preparation module 232A is adapted to receive the bonding material 360 in a sheet form and perform one or more cutting operations to provide a bonding material, such as Polyvinyl Butyral (PVB) or Ethylene Vinyl Acetate (EVA) sized to form a reliable seal between the backside glass and the solar cells formed on the device substrate 303. In general, when using bonding materials 360 that are polymeric, it is desirable to control the temperature (e.g., 16-18° C.) and relative humidity (e.g., RH 20-22%) of the solar cell production line 200 where the bonding material 360 is stored and integrated into the solar cell device to assure that the attributes of the bond formed in the bonding module 234 are repeatable and the dimensions of the polymeric material are stable. It is generally desirable to store the bonding material prior to use in temperature and humidity controlled area (e.g., T=6-8° C.; RH=20-22%).

The tolerance stack up of the various components in the bonded device (Step 134) can be an issue when forming large solar cells. Therefore, accurate control of the bonding material properties and tolerances of the cutting process assure that a reliable hermetic seal is formed. In one embodiment, PVB may be used to advantage due to its UV stability, moisture resistance, thermal cycling, good US fire rating, compliance with Intl Building Code, low cost, and reworkable thermoplastic properties.

In one part of step 132, the bonding material 360 is transported and positioned over the back contact layer 350, the side-buss 355 (FIG. 3C), and the cross-buss 356 (FIG. 3C) elements of the device substrate 303 using an automated robotic device. The device substrate 303 and bonding material 360 are then positioned to receive a back glass substrate 361, which can be placed thereon by use of the same automated robotic device used to position the bonding material 360, or a second automated robotic device.

In one embodiment, prior to positioning the back glass substrate 361 over the bonding material 360, one or more preparation steps are performed to the back glass substrate 361 to assure that subsequent sealing processes and final solar product are desirably formed. In one case, the back glass substrate 361 is received in a "raw" state where the edges, overall size, and/or cleanliness of the substrate 361 are not well controlled. Receiving "raw" substrates reduces the cost to prepare and store substrates prior to forming a solar device and thus reduces the solar cell device cost, facilities costs, and production costs of the finally formed solar cell device. In one embodiment of step 132, the back glass substrate 361 surfaces and edges are prepared in a seaming module (e.g., seamer 204) prior to performing the back glass substrate cleaning step. In the next sub-step of step 132, the back glass substrate 361 is transported to the cleaning module 232C in which a substrate cleaning step is performed on the substrate 361 to remove any contaminants found on the surface of the substrate 361. Common contaminants may include materials deposited on the substrate 361 during the substrate forming process (e.g., glass manufacturing process) and/or during shipping of the substrates 361. Typically, the cleaning module 232C uses wet chemical scrubbing and rinsing steps to remove any undesirable contaminants as discussed above. The prepared back glass substrate 361 is then positioned over the bonding material and the device substrate 303 by use of an automated robotic device.

Next the device substrate 303, the back glass substrate 361, and the bonding material 360 are transported to the bonding module 234 in which step 134, or lamination steps are performed to bond the backside glass substrate 361 to the device substrate formed in steps 102-130 discussed above. In step 134, a bonding material 360, such as Polyvinyl Butyral (PVB) or Ethylene Vinyl Acetate (EVA), is sandwiched between the backside glass substrate 361 and the device substrate 303. Heat and pressure are applied to the structure to form a bonded and sealed device using various heating elements and other devices found in the bonding module 234. The device substrate 303, the back glass substrate 361, and the bonding material 360 thus form a composite solar cell structure 304 (FIG. 3D) that at least partially encapsulates the active regions of the solar cell device. In one embodiment, at least one hole formed in the back glass substrate 361 remains at least partially uncovered by the bonding material 360 to allow portions of the cross-buss 356 or the side buss 355 to remain exposed so that electrical connections can be made to these regions of the solar cell structure 304 in future steps (i.e., step 138).

Next the composite solar cell structure 304 is transported to the autoclave module 236 in which step 136, or autoclave steps are performed on the composite solar cell structure 304 to remove trapped gasses in the bonded structure and assure that a good bond is formed during step 134. In step 134, a bonded solar cell structure 304 is inserted in the processing region of the autoclave module where heat and high pressure gases are delivered to reduce the amount of trapped gas and improve the properties of the bond between the device substrate 303, back glass substrate, and bonding material 360. The processes performed in the autoclave are also useful to assure that the stress in the glass and bonding layer (e.g., PVB layer) are more controlled to prevent future failures of the hermetic seal or failure of the glass due to the stress induced during the bonding/lamination process. In one embodiment, it may be desirable to heat the device substrate 303, back glass substrate 361, and bonding material 360 to a temperature that causes stress relaxation in one or more of the components in the formed solar cell structure 304.

Next the solar cell structure 304 is transported to the junction box attachment module 238 in which junction box attachment steps 138 are performed on the formed solar cell structure 304. The junction box attachment module 238, used during step 138, is used to install a junction box 370 (FIG. 3C) on a partially formed solar cell. The installed junction box 370 acts as an interface between the external electrical components that will connect to the formed solar cell, such as other solar cells or a power grid, and the internal electrical connections points, such as the leads, formed during step 131. In one embodiment, the junction box 370 contains one or more junction box terminals 371, 372 so that the formed solar cell can be easily and systematically connected to other external devices to deliver the generated electrical power.

Next the solar cell structure 304 is transported to the device testing module 240 in which device screening and analysis steps 140 are performed on the solar cell structure 304 to assure that the devices formed on the solar cell structure 304 surface meet desired quality standards. In one embodiment, the device testing module 240 is a solar simulator module that is used to qualify and test the output of the one or more formed solar cells. In step 140, a light emitting source and probing device are used to measure the output of the formed solar cell device by use of one or more automated components adapted to make electrical contact with terminals in the junction box 370. If the module detects a defect in the formed device it can take corrective actions or the solar cell can be scrapped. A more detailed description of the device testing module 240 is presented below in the section entitled "Solar Simulator and Processes."

Next the solar cell structure 304 is transported to the support structure module 241 in which support structure mounting steps 141 are performed on the solar cell structure 304 to provide a complete solar cell device that has one or more mounting elements attached to the solar cell structure 304 formed using steps 102-140 to a complete solar cell device that can easily be mounted and rapidly installed at a customer's site.

Next the solar cell structure 304 is transported to the unload module 242 in which step 142, or device unload steps are performed on the substrate to remove the formed solar cells from the solar cell production line 200.

In one embodiment of the solar cell production line 200, one or more regions in the production line are positioned in a clean room environment to reduce or prevent contamination from affecting the solar cell device yield and useable lifetime. In one embodiment, as shown in FIG. 2, a class 10,000 clean room space 250 is placed around the modules used to perform steps 108-118 and steps 130-134.

Solar Simulator Module Design and Processes

In one embodiment, the device testing module 240 comprises a solar simulator module for qualifying and testing the output of the one or more formed solar cell structures 304, such as solar cell 300 depicted in FIGS. 3A-E. In one embodiment, a light emitting source and automated probing device are used to measure the output of the formed solar cell structure 304 by use of various automated components adapted to make electrical contact with the junction box terminals 371, 372 (FIG. 3C) in the junction box 370. During testing, to assure that the solar cell structure 304 has desirable electrical characteristics, the active region(s) of the solar cell structure 304 are exposed to a known amount of light energy within a desired range of wavelengths. If the solar simulator module detects a defect in the measured output characteristics of the solar cell structure 304, the system controller 290 can take corrective actions or the solar cell structure 304 can be scrapped. If the output of the formed device meets the user defined requirements, a back surface of the solar cell structure 304 receives a label that denotes the actual measured electrical characteristics of the device, and the solar cell structure 304 is allowed to proceed to the next step in the solar cell fabrication process sequence 100. In one embodiment, multiple solar cell structures 304 can be tested at once, such as a 2.2×2.6 m (e.g., Gen 8.5) formed solar cell device that has been sectioned to form two or four smaller solar cell structures 304.

Figure 4A:
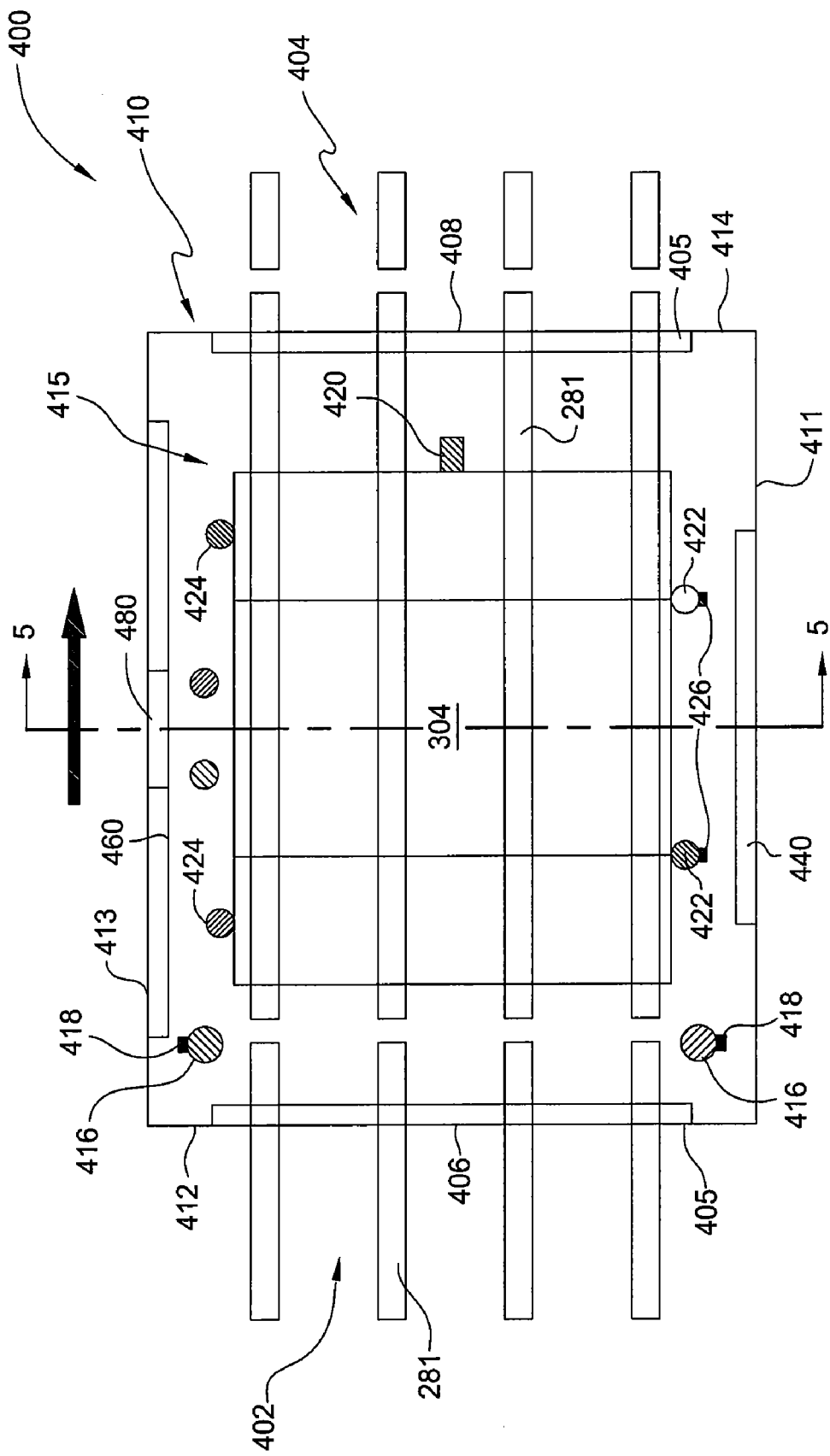
FIG. 4A is a schematic plan view of a solar simulator module according to one embodiment of the present invention.
Figure 4B:
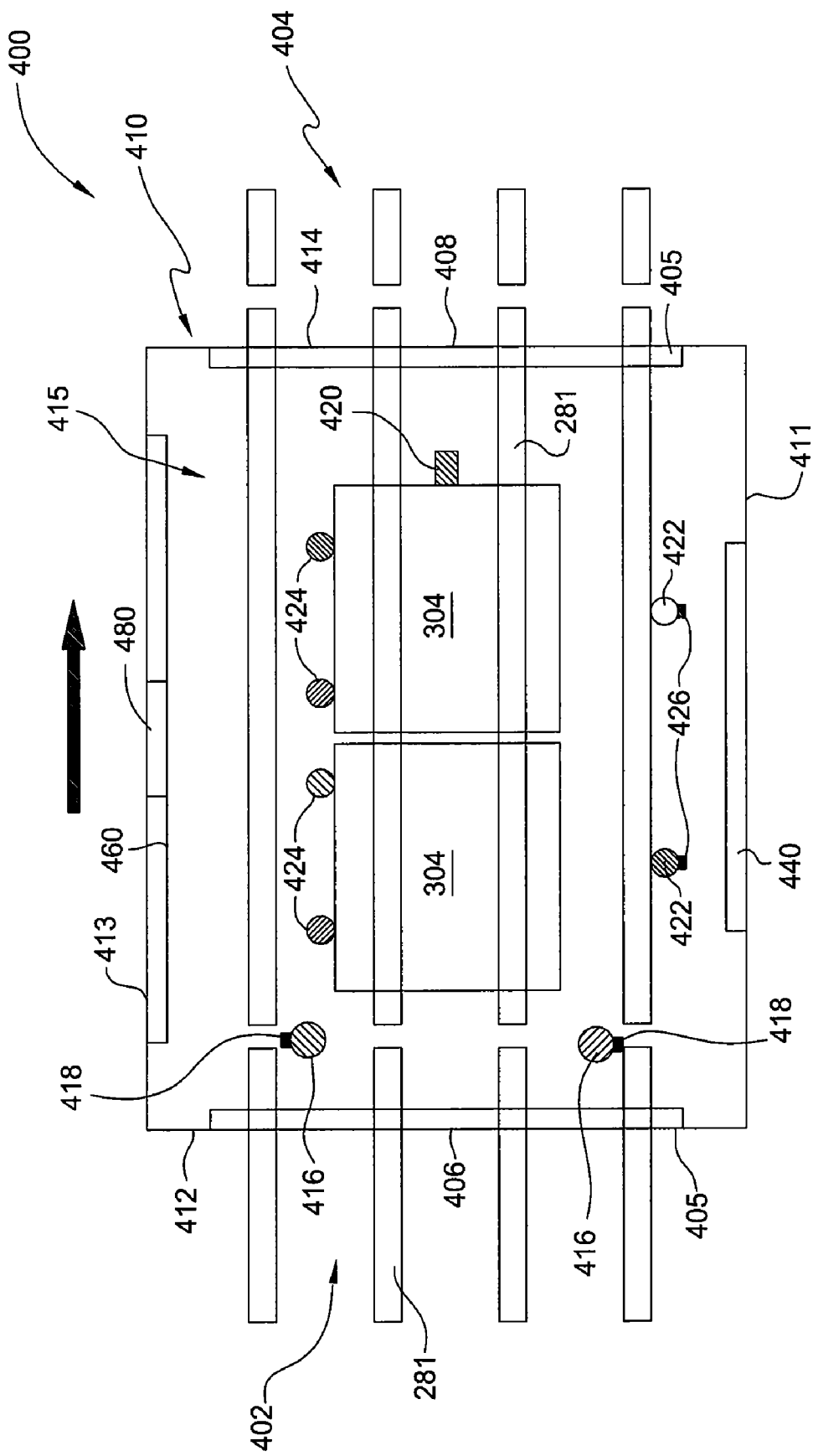
FIG. 4B is a schematic top plan view of the solar simulator module depicted in FIG. 4A adjusted to test two quarter sized solar cell structures.

FIG. 4A is a schematic plan view of a solar simulator module 400 according to one embodiment of the present invention. The embodiment of the solar simulator module 400 depicted in FIG. 4A is configured for testing a full sized solar cell structure 304 (e.g. 2.2 m×2.6 m) or a half sized solar cell structure 304 (e.g. 2.2 m×1.3 m). FIG. 4B is a schematic plan view of the solar simulator module 400 depicted in FIG. 4A adjusted to test two quarter sized solar cell structures 304 (e.g. 1.1 m×1.3 m).

In one embodiment, the solar simulator module 400 comprises an enclosure 410 having walls 411-414 positioned around and enclosing a testing region 415 such that stray light and reflections do not affect the quality of the testing performed on the solar cell 300. The walls 411-414 of the enclosure 410 may be covered by a dark material, such as black felt, in order to minimize reflections in the testing region. In one embodiment, at least one of the walls 411-414 has one or more reflectors 405 disposed thereon. The solar simulator module 400 further comprises a light source 440, a positioning robot 460, and one or more probe nests 480, all disposed within the enclosure 410.

In one embodiment, the solar cell structure 304 is transferred into the testing region 415 from an input conveyor 402 via the automation device 281 prior to testing. Guide rollers 416 may be positioned to guide the edges of the solar cell structure 304 into the testing region 415. In one embodiment, the positions of the guide rollers 416 are adjustable to accommodate different sized solar cell structures 304. For instance, FIG. 4A depicts guide rollers 416 positioned to direct either a full sized solar cell structure 304 or a half sized solar cell structure 304 into the testing region 415. FIG. 4B depicts the guide rollers 416 adjusted into a narrower position for directing one or more quarter sized solar cell structures 304 into the testing region 415. In one embodiment, the guide rollers 416 may be configured for manual adjustment. In another embodiment, the guide rollers 416 may be automatically adjusted via linear translation members 418, such as pneumatic cylinders, linear motors, or the like.

In one embodiment, an alignment mechanism 420 is disposed within the testing region 415 to detect when the solar cell structure 304 is correctly positioned on the automation device 281 for the next step in the testing process. The alignment mechanism 420 may comprise one or more position sensors for detecting a leading edge of the solar cell structure 304 as shown in FIGS. 4A and 4B. In one embodiment, one or more locating members 422 and one or more stop members 424 are disposed within the testing region 415 for positioning the solar cell structure 304. In one embodiment, the stop members 424 and the locating members 422 are adjustable. FIG. 4A depicts the locating members 422 and the stop members 424 located to position a full or half sized solar cell structure 304. FIG. 4B depicts the locating members 422 and the stop members 424 located to position a plurality of quarter sized solar cell structures 304. In one embodiment, the stop members 424 may be manually adjusted into the appropriate position for the solar structure 304 size. The locating members 422 may be attached to linear translation members 426, such as pneumatic cylinders, linear motors, or the like. In this embodiment, the linear translation members 426 may cause the locating members 422 to push the solar cell structure 304 against the stop members 424. In another embodiment, both the stop members 424 and the locating members 422 are attached to linear translation members 426 for positioning the solar cell structure 304. The system controller 290 receives signals from the alignment mechanism 420 and sends signals to control the automation device 281 and the linear translation members 426 for correctly positioning the solar cell structure 304.

After testing is complete, the solar cell structure 304 may be transferred from the testing region 415 via the automation device 281 onto an output conveyor 404. In one embodiment, a slit 406 is disposed through the wall 412 adjacent the input conveyor 402, and a slit 408 is disposed through the wall 414 adjacent the output conveyor 404 to allow the transfer of the solar cell structure 304.

Figure 5A:
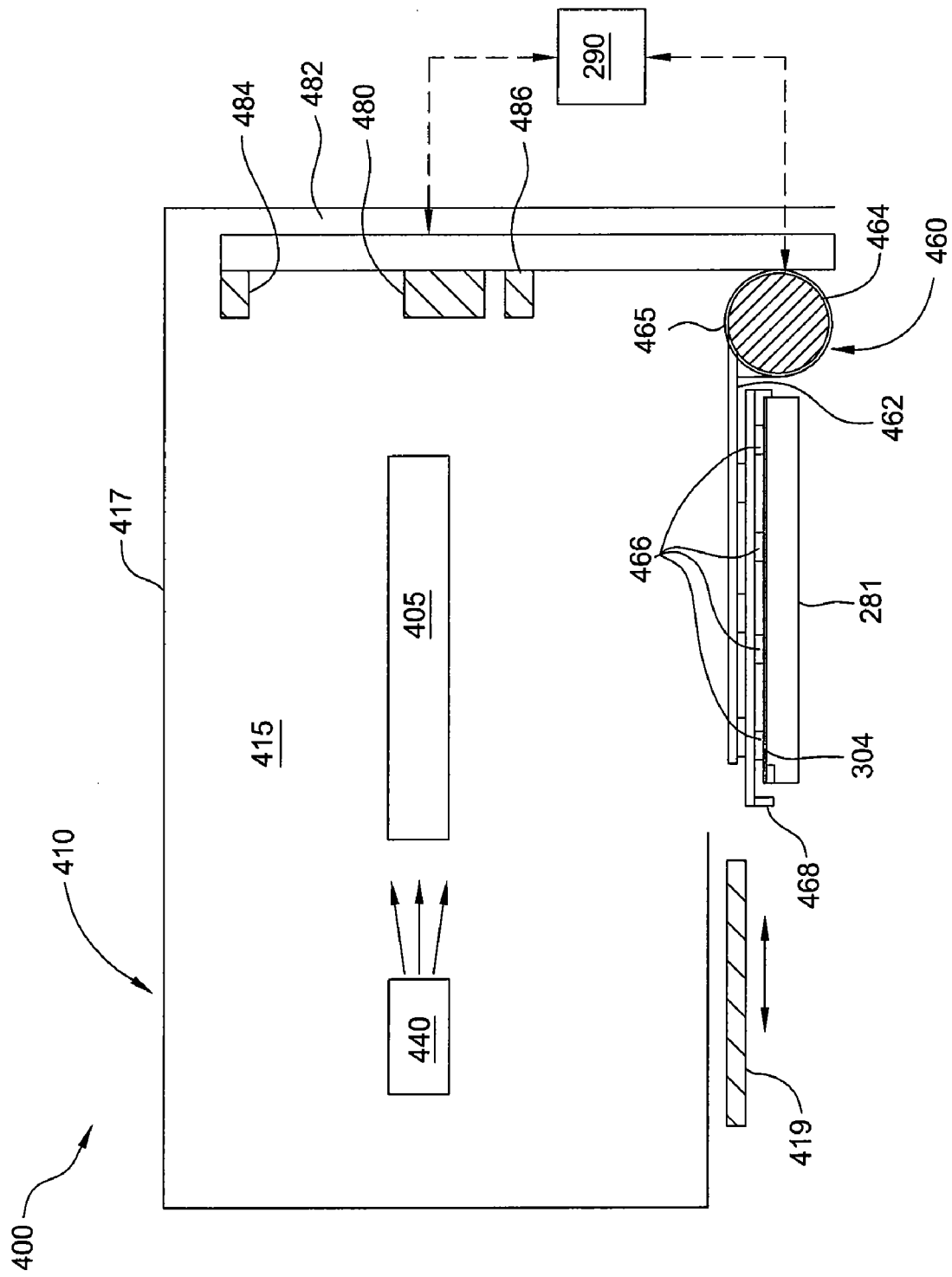
FIG. 5A is a schematic, cross-sectional view of the solar simulator taken along line 5-5 of FIG. 4A depicting the positioning robot in a loading/unloading position.
Figure 5B:
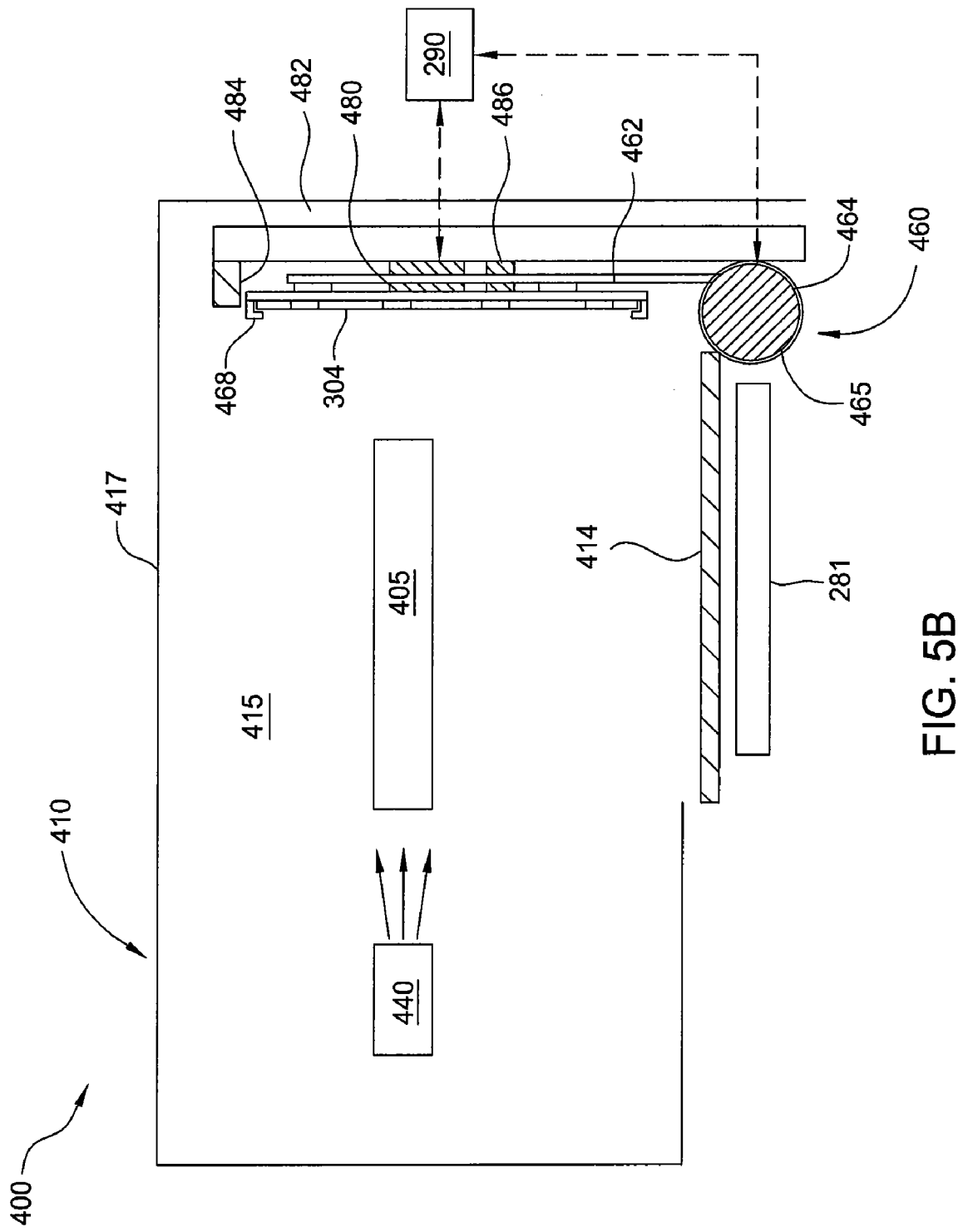
FIG. 5B is a schematic, cross-sectional view of the solar simulator taken along line 5-5 of FIG. 4A depicting the positioning robot in a testing position.

FIG. 5A is a schematic, cross-sectional view of the solar simulator module 400 taken along line 5-5 of FIG. 4A depicting the positioning robot 460 in a loading/unloading position. FIG. 5B is a schematic, cross-sectional view of the solar simulator module 400 taken along line 5-5 of FIG. 4A depicting the positioning robot 460 in a testing position.

In one embodiment, the positioning robot 460 comprises a gantry 462, a rotary actuator 464, a rotary brake 465, intermediate support elements 466, and edge support elements 468. The gantry 462 has a plurality of the intermediate support elements 466 and the edge support elements 468 attached thereto for grasping and holding the solar cell structure 304. In one embodiment, the intermediate support elements 466 are vacuum gripping elements for contacting and holding the back glass substrate 361 of the solar cell structure 304. The intermediate support elements 466 may be arranged into independently controlled zones to accommodate different sized solar cell structures 304. In one embodiment, the edge support elements 468 are pneumatically actuated swing-arm clamps for grasping the non-functional edges of the solar cell structure 304 during movement and testing procedures. Additionally, the edge support elements 468 may provide holding capability in the event suction is lost in the intermediate support elements 466. The function of the intermediate support elements 466 and the edge support elements 468 are controlled by the system controller 290.

In one embodiment, the rotary actuator 464 is a motor coupled to the gantry 462 for rotating the gantry 462 from a substantially horizontal, loading/unloading position to a substantially vertical testing position. The rotary brake 465 provides holding capability in the event power is lost during movement of the gantry 462. The function of the rotary actuator 464 may be controlled by the system controller 290.

In one embodiment, one or more probe nests 480 are attached to a vertical support member 482 for connecting to the electrical connection points of the junction box terminals 371, 372 of the solar cell structure 304 in the vertical, testing position. In one embodiment, the probe nest 480 further comprises self aligning tooling, which utilizes datum features of the junction box 370 to orient measurement probes within the probe nest 480 with the electrical connection points of the junction box terminals 371, 372. In one embodiment, the measurement probes are compliant pin members to provide additional tolerance and flexibility when connecting to the junction box terminals 371, 372.

In one embodiment, one or more reference cells 484 may be attached to the vertical support member 482 to receive light from the light source 440. The reference cell 484 may be used by the system controller 290 to monitor and control the output of the light source 440. In one embodiment, a plurality of reference cells 484 may be used to account for different p-n junctions in a multiple junction solar cell device, such as the tandem junction solar cell 300 illustrated in FIG. 3B. In one embodiment, one reference cell 484 may be configured to absorb an overall light spectrum, another reference cell 484 may be configured to absorb light solely in the red spectrum, and yet another reference cell 484 may be configured to absorb light solely in the blue spectrum.

In one embodiment, one or more temperature sensors 486 may be mounted to the vertical support member 482. The temperature sensor 486 may be spring loaded to remain in contact with the back side of the solar cell structure 304 during the testing process.

In one embodiment, the light source 440 is oriented such that a flash of light is directed substantially horizontally toward the solar cell structure 304 held in the substantially vertical testing position by the positioning robot 460. The light source 440 may comprise one or more flash lamps configured to simulate the solar spectrum. In one embodiment, the light source 440 is configured to emit a flash of light for between about 9 ms to about 11 ms at an intensity from about 75 mW/cm$^2$ to about 125 mW/cm$^2$ toward the solar cell structure 304 being tested. In one embodiment, the light source 440 may include a filter (not shown) configured to remove wavelengths of light outside of the solar spectrum.

Conventional testing configurations generally require the light source to be in excess of 6.5 meters above a horizontally oriented 2.2 m×2.6 m solar cell structure during the testing. Thus, the horizontal configuration of the light source 440 toward a vertically oriented solar cell structure 304 improves the serviceability of the solar simulator module 400 because the light source is much lower to the ground and more readily accessible than conventional solar simulators having light sources vertically oriented above a horizontally oriented solar cell. Additionally, the overall footprint of the solar simulator module 400 may be substantially smaller than conventional solar simulators.

In one embodiment, the enclosure 410 further comprises a top member 417 and a bottom member 419 for fully enclosing the testing region 415 to prevent light from entering the enclosure 410 during testing of the solar cell structure 304. The bottom member 419 may be a retractable screen positioned in an automated fashion with an actuating device, such as a linear motor, pneumatic cylinder, or the like, over the bottom portion of the enclosure 410 to further prevent light outside the enclosure 410 from affecting the testing process. The bottom member 419 forms a portion of the testing region 415 that encloses the light source and solar cell structure 304 to provide light uniformity, intensity consistency, testing repeatability, and testing reliability. The top member 417 and the bottom member 419 may be fully lined with a dark material, such as black felt, to prevent unwanted reflections and enable a repeatable testing environment.

In one embodiment of the present invention, the testing region 415 is optimized to allow spacing between the solar cell structure 304 and the light source 440 to be between about 4.4 m and about 6.5 m and still achieve a Class A certification. In one embodiment, the reflectors 405 are configured within the testing region 415 to increase concentration and uniformity of light on the solar cell structure 304.

Figure 6:
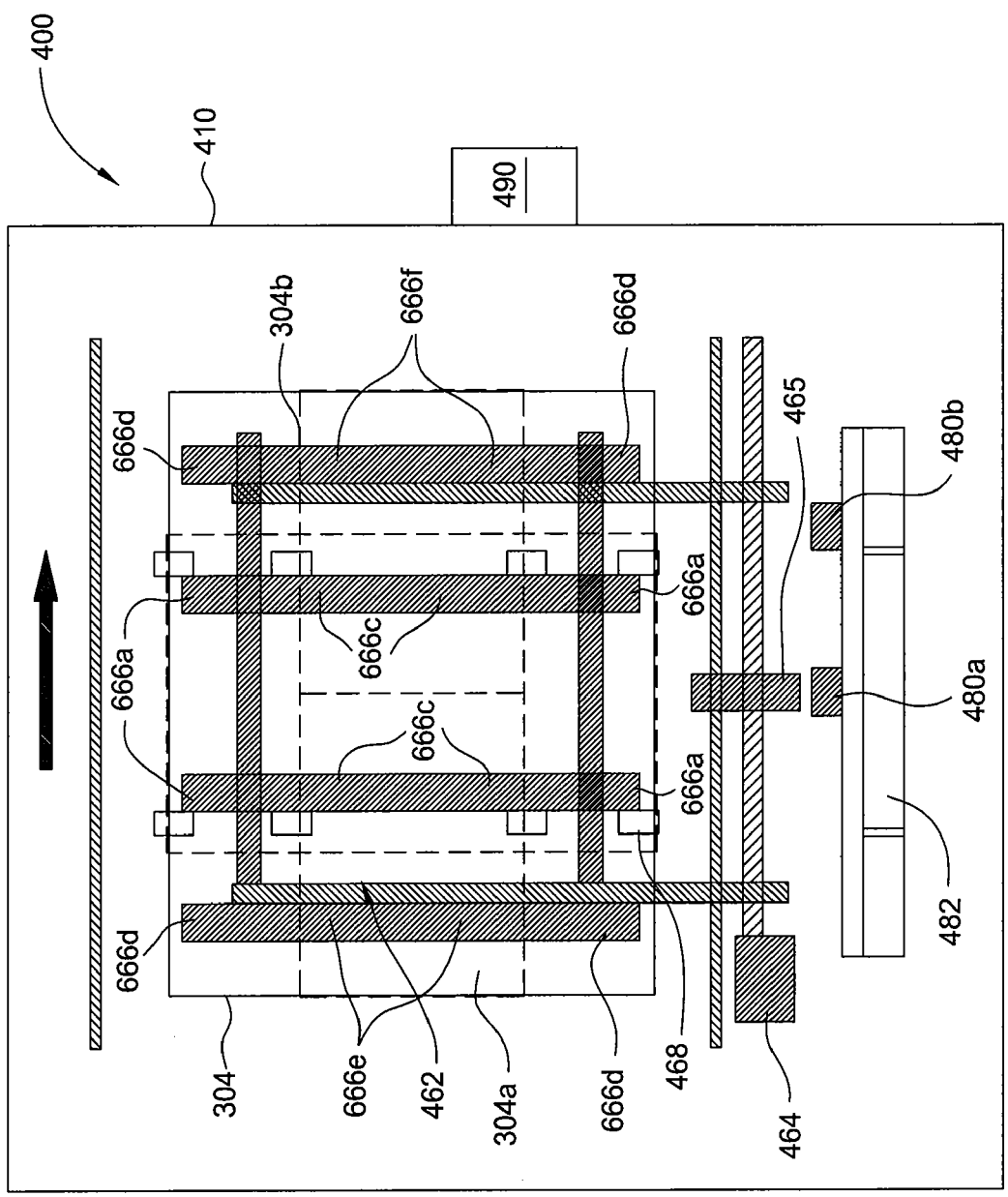
FIG. 6 is a schematic, top plan view of the solar simulator module with the gantry in the horizontal loading/unloading position as depicted in FIG. 5A.

FIG. 6 is a schematic, plan view of the solar simulator module 400 with the gantry 462 in the horizontal loading/unloading position as depicted in FIG. 5A. In the embodiment depicted in FIG. 6, two probe nests 480a, 480b are mounted to the vertical support member 482. In one embodiment, the probe nest 480a is laterally positionable on the vertical support member 482 via a linear actuator, such as a linear motor, pneumatic cylinder, or the like. The other probe nest 480b may be mounted in a fixed location or laterally positionable as well. In one embodiment, the probe nest 480a may be centrally located (as shown in FIG. 6) for connecting to the junction box 370 of a full or half size solar cell structure 304. In one embodiment, the probe nest 480a may be translated laterally to connect to the junction box of a quarter size solar cell structure 304a, while the probe nest 480b may connect to the junction box 370 of another quarter size solar cell structure 304b. Thus, in the aforementioned embodiment, two quarter solar cell structures may be simultaneously tested in the solar simulator module 400.

The multiple solar cell testing configuration allows the production line 200 to form a large solar cell device that can be sectioned into smaller solar cell structures 304 and then simultaneously tested in an automated fashion without user intervention. Thus, improvements in the reliability, throughput, and efficiency of the solar simulator module 400, and thus the solar cell formation process sequence 100, may be achieved.

Still referring to FIG. 6, the intermediate support elements 466 may be divided into several independently controlled zones to accommodate different sized solar cell structures 304. In one embodiment, the support elements 466 are divided into six independently controllable zones, which are labeled 666a-f in FIG. 6. Thus, in one embodiment, the system controller 290 may be programmed to supply vacuum to the particular zones in accordance with the size of the solar cell structure 304 being tested. For instance, in order to load a full size solar cell structure 304, all six zones 666a-f may be activated. Alternatively, in order to load a half size solar cell structure 304, only zones 666a, 666b, and 666c need be activated. Similarly, in order to load two quarter solar cell structures 304a,b, only zones 666b, 666c, 666e, and 666f need be activated.

In one embodiment, the solar simulator module 400 further comprises an automated label device 490 positioned outside of the enclosure 410. The automated label device 490 communicates with the system controller 290 and affixes a label to each tested solar cell structure 304 after testing. The label may include information gathered from the testing of each individual solar cell structure such as a unique serial number for each formed solar cell structure 304, the solar cell structure's electrical characteristics (e.g., open circuit voltage, maximum power, short circuit current, and efficiency), any relevant safety information, and any custom information or designs that may be specified by a customer.

In one embodiment, the system controller 290 includes software for calculating both a measured efficiency and an operating efficiency of each solar cell structure 304 tested. In one embodiment, the measured efficiency is the efficiency calculated for the solar cell structure 304 as tested in the solar simulator module 400. In one embodiment, the operating efficiency is the efficiency calculated taking additional factors into account, such as expected light induced degradation of the solar cell structure 304 over a period of time. The measured and/or operating efficiencies may be printed on the label for affixing to the tested solar cell structure 304 as well.

Figure 7:
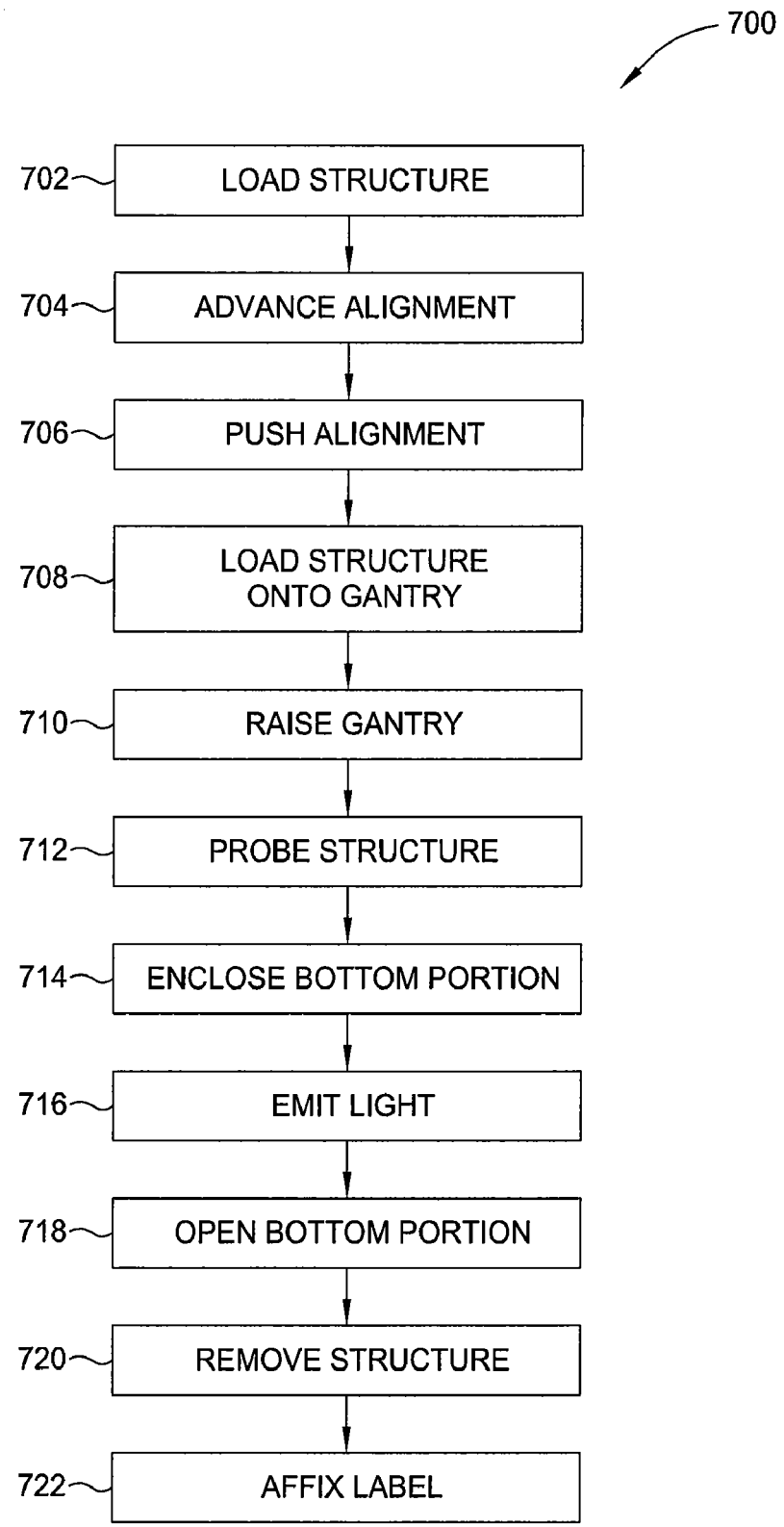
FIG. 7 is a schematic depiction of an operating sequence of the solar simulator module according to one embodiment of the present invention.

FIG. 7 is a schematic depiction of an operating sequence 700 of the solar simulator module 400 according to one embodiment of the present invention. A solar cell structure 304 is first introduced to the automation device 281 of the solar simulator module 400 in step 702 from the input conveyor 402. In one embodiment, the solar cell structure 304 comprises a full size panel (e.g. 2.4 m×2.6 m). In another embodiment, the solar cell structure 304 is a half size panel (e.g. 2.4×1.3), which may be sectioned from the full size panel. In yet another embodiment, the solar cell structure 304 comprises two quarter size panels (e.g. 1.2×1.3), which may be sectioned from the full or half size panel.

In one embodiment, the solar cell structure 304 is fed into the test region 415 of the enclosure 410 through the slit 406 in the wall 412. In one embodiment, one or more of the guide rollers 416 may be moved to assure that the edges of the solar cell structure 304 are properly aligned as the solar cell structure 304 advances into the test region 415. In step 704, the automation device 281 advances the solar cell structure 304 until the alignment mechanism 420 senses that the leading edge of the solar cell structure 304 is in position. In step 706, the locating members 422 are actuated to push the solar cell structure 304 against the stop members 424 to properly align the solar cell structure for loading onto the positioning robot 460.

In step 708, the gantry 462 of the positioning robot 460 is rotated into the loading position via the rotary actuator 464. Suction is applied to the appropriate zones of the intermediate support elements 466 according to the size of the solar cell structure 304 being tested. In one embodiment, the edge support elements 468 are then rotated into position to further support the solar cell structure 304 against the gantry 462 of the robot 460. In one embodiment, datum features of the junction box 370 are used to position the solar cell structure 304.

In step 710, the rotary actuator 464 rotates the gantry 462 of the robot 460 upwardly to configure the solar cell structure 304 into a substantially vertical orientation. Both the intermediate support elements 466 and the edge support elements 466 hold the solar cell structure 304 in the substantially vertical orientation.

In step 712, the probe nest 480 makes electrical contact with the junction box terminals 371, 372 in the junction box 370 of the solar cell structure 304. In one embodiment, the centrally oriented probe nest 480 is located to make electrical contact with the junction box terminals 371, 372 of a full or half size solar cell structure 304. In one embodiment, the centrally oriented probe nest 480 is located to make electrical contact with the junction box terminals 371, 372 of one quarter size solar cell structure 304a, and another probe nest 480 is located to make electrical contact with the junction box terminals 371, 372 of another quarter size solar cell structure 304b. In one embodiment, datum features of the junction box 370 are used to position the probe nest 480. At substantially the same time, the one or more temperature sensors 486 contact the back side of the solar cell structure(s) 304.

In step 714, the bottom member 419 of the enclosure 410 may be extended to fully enclose the bottom portion of the testing region 415.

In step 716, the light source 440 flashes light in specified wavelengths simulating the solar spectrum substantially horizontally toward the one or more solar cell structures 304. In one embodiment, electrical properties including the open circuit voltage, the maximum power, the short circuit current, and the efficiency are measured and captured. In one embodiment, the reference cell 484 may be used by the system controller 290 to monitor and control the output of the light source 440.

In step 718, the bottom member 419 of the enclosure 410 is retracted and the gantry 462 of the robot 460 is rotated to its horizontal unloading position. The solar cell structure 304 is then released by both the edge support elements 468 and the intermediate support elements 466 and placed onto the automation device 281 for removal from the enclosure 410.

In step 720, the solar cell structure 304 may be fed out of the test region 415 of the enclosure 410 through the slit 408 in the wall 414. In step 722, a label may be affixed to the back surface of the solar cell structure 304 including such information as the solar cell structure's unique serial number, the solar cell structure's measured electrical characteristics, any relevant safety information regarding the solar cell structure 304, and any custom design or information desired by a customer.

Therefore, the solar simulator module 400 may be integrated into a production line 300 of thin-film PV solar cell modules as discussed above. During operation the solar cell structure 304 may be rough located when entering the solar simulator module. The solar cell structure 304 may then be rotated to a vertical orientation to face the light source 440, and measurements may be performed. The probe nest 480 locates and probes the junction box 370, and the temperature sensor 486 senses the temperature of the panel (for normalization of the measurements for temperature). Once the measurements are complete the probe nest 480 is disconnected, and the solar cell structure 304 is placed back onto the automation device 281. A label may then be attached while the solar cell structure 304 is removed from the solar simulator module 400. In one embodiment, the system is capable of processing at least two modules, such as when quarter size solar cell structures 304 are being run through the production line 200.

While the foregoing is directed to embodiments of the present invention, other and further embodiments of the invention may be devised without departing from the basic scope thereof, and the scope thereof is determined by the claims that follow.

The invention claimed is:

1. A solar simulator module, comprising:
an enclosure defining a testing region of the module;
an automation device configured to horizontally translate a solar cell structure into the testing region;
an alignment mechanism disposed within the testing region configured to horizontally locate the solar cell structure;
a robot having a gantry with support elements configured to grasp and hold the solar cell structure and a rotary actuator configured to rotate the gantry from a substantially horizontal orientation to a substantially vertical orientation;
a probe nest positioned to make electrical connection with junction leads from the solar cell structure while in the substantially vertical orientation; and
a light source configured to emit a flash of light simulating the solar spectrum substantially horizontally toward the solar cell structure while in the substantially vertical orientation.

2. The solar simulator module of claim 1, wherein the enclosure comprises at least two opposing walls having a slit formed therethrough, and wherein the slit is sized to transmit the solar cell structure therethrough.

3. The solar simulator module of claim 2, wherein a system controller receives signals from the alignment mechanism and transmits signals to the automation device for laterally positioning the solar cell structure.

4. The solar simulator module of claim 3, further comprising locating members and stop members located within the testing region, wherein the locating members are attached to a linear actuator for pushing the solar cell structure against the stop members.

5. The solar simulator module of claim 4, wherein the enclosure further comprises a retractable bottom member.

6. The solar simulator module of claim 1, further comprising a reference cell in communication with a system controller for monitoring and controlling the light source.

7. The solar simulator module of claim 6, further comprising a temperature sensor configured to contact a back side of the solar cell structure when the gantry is in the substantially vertical orientation.

8. The solar simulator module of claim 7, wherein the light source is configured between about 4.4 meters and about 6.5 meters from the solar cell structure when the gantry is in the substantially vertical position.

9. The solar simulator module of claim 1, wherein the support elements comprise intermediate vacuum support elements and rotational edge support elements.

10. The solar simulator module of claim 9, wherein the intermediate vacuum support elements are configured in a plurality of independently controllable zones.

11. The solar simulator module of claim 10, wherein the probe nest is laterally translatable.

12. The solar simulator module of claim 1, further comprising:
a laterally translatable roller guide member configured to guide the solar cell structure into the testing region;
an enclosure bottom having a linear actuator configured to extend the enclosure bottom to fully enclose the testing region when the gantry is in the substantially vertical orientation; and
an automated label device in communication with a system controller, wherein the automated label device is configured to affix a label to the back surface of the solar cell structure.

13. A process for testing a solar cell structure, comprising:
transferring the solar cell structure into an enclosure defining a testing region therein;
horizontally positioning the solar cell structure within the testing region;
grasping the solar cell structure with a positioning robot;
rotating the solar cell structure from a substantially horizontal position to a substantially vertical position;
electrically connecting the solar cell structure to a probe nest;
emitting a flash of light simulating the solar spectrum in a substantially horizontal orientation toward the vertically oriented solar cell structure;
measuring the electrical characteristics of the solar cell structure;
rotating the solar cell structure from the substantially vertical position to the substantially horizontal position;
releasing the solar cell structure; and
transferring the solar cell structure out of the enclosure.

14. The process of claim 13, further comprising printing a label containing the measured electrical characteristics thereon and attaching the label to a back surface of the solar cell structure.

15. The process of claim 14, wherein transferring the solar cell structure into the enclosure comprises transferring the solar cell structure through a slit in the enclosure and guiding edges of the solar cell structure with roller guides.

16. The process of claim 15, wherein horizontally positioning the solar cell structure within the testing region comprises feeding the solar cell structure in a forward direction until a leading edge of the solar cell structure is detected by an alignment mechanism and pushing the solar cell structure laterally against stop members.

17. The process of claim 16, wherein grasping the solar cell structure comprises selectively applying vacuum to the solar cell structure via a plurality of intermediate vacuum support elements attached to a gantry of the positioning robot and rotating a plurality of edge support elements to hold edges of the solar cell structure against the gantry.

18. The process of claim 17, wherein the flash of light is emitted from between about 9 miliseconds and about 11 miliseconds at an intensity from between about 75 mW/cm$^2$ and about 125 mW/cm$^2$.

19. A solar simulator module, comprising:
an enclosure having a top, walls, and a retractable bottom defining a testing region of the module, wherein at least one wall of the enclosure has a slit formed therethrough sized for transferring a solar cell structure therethrough;
a roller guide configured to guide an edge of the solar cell structure into the testing region;
an automation device in communication with an alignment mechanism configured to longitudinally position a plurality of solar cell structures within the testing region;
a plurality of locating members configured to laterally translate the plurality of solar cell structures within the testing region;
a robot disposed within the enclosure, wherein the robot comprises a gantry having a plurality of support elements disposed thereon and configured to grasp the plurality of solar cell structures and a rotary actuator configured to rotate the gantry from a substantially horizontal orientation to a substantially vertical orientation;

a plurality of probe nests, each positioned to make electrical contact with one of the plurality of solar cell structures, wherein at least one of the probe nests is laterally positionable; and a light source configured to emit a flash of light simulating the solar spectrum substantially horizontally toward the vertically oriented solar cell structures.

20. The solar simulator module of claim 19, wherein the plurality of support elements comprises a plurality of vacuum support elements configured in a plurality of independently controllable zones and a plurality of edge support elements.

21. The solar simulator module of claim 20, further comprising:

a reference cell in communication with a system controller for monitoring and controlling the light source;

a temperature sensor configured to contact at least one of the plurality of solar cell structures when the gantry is in the substantially vertical orientation; and an automated label device in communication with the system controller, wherein the automated label device is configured to affix a label to each of the solar cell structures.

22. A solar cell device processing system, comprising:

an automation device positioned to receive a horizontally oriented solar cell device from a junction box attachment module of the processing system and transfer the solar cell device through a slit in a wall of an enclosure and into a testing area defined within the enclosure;

an alignment mechanism in communication with the automation device for horizontally positioning the solar cell device within the testing area;

a positioning robot disposed within the testing area, wherein the robot comprises a gantry with support elements attached thereto and configured to grasp and hold the solar cell device and a rotary actuator for rotating the gantry from a substantially horizontal position to a substantially vertical position;

a probe nest positioned to make electrical connection with junction leads from the solar cell device when the gantry is in the substantially vertical position;

a light source configured to emit a flash of light simulating the solar spectrum substantially horizontally toward the vertically oriented solar cell device; and an automated labeling mechanism configured to affix a label to a back surface of the solar cell device.

23. The solar cell device processing system of claim 22, further comprising a plurality of locating members disposed within the enclosure configured to laterally move a plurality of solar cell devices against a plurality of stop members disposed within the enclosure.

24. The solar cell device processing system of claim 23, wherein the support elements comprise a plurality of vacuum support elements arranged in a plurality of independently controllable zones.

25. The solar cell device processing system of claim 24, wherein the probe nest comprises a plurality of probe nests configured to electrically connect to a plurality of solar cell devices substantially simultaneously.

* * * * *